US009824973B2

(12) United States Patent
Lee et al.

(10) Patent No.: US 9,824,973 B2
(45) Date of Patent: Nov. 21, 2017

(54) INTEGRATED CIRCUIT DEVICES HAVING THROUGH-SILICON VIA STRUCTURES AND METHODS OF MANUFACTURING THE SAME

(71) Applicant: Samsung Electronics Co., Ltd., Suwon-si, Gyeonggi-do (KR)

(72) Inventors: Ho-jin Lee, Seoul (KR); Byung-lyul Park, Seoul (KR); Jin-ho An, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/235,608

(22) Filed: Aug. 12, 2016

(65) Prior Publication Data
US 2017/0053872 A1    Feb. 23, 2017

(30) Foreign Application Priority Data
Aug. 17, 2015    (KR) .......................... 10-2015-0115413

(51) Int. Cl.
| | | |
|---|---|---|
| H01L 23/48 | (2006.01) |
| H01L 23/52 | (2006.01) |
| H01L 29/40 | (2006.01) |
| H01L 23/538 | (2006.01) |
| H01L 23/00 | (2006.01) |
| H01L 21/768 | (2006.01) |

(52) U.S. Cl.
CPC .... *H01L 23/5384* (2013.01); *H01L 21/76841* (2013.01); *H01L 21/76879* (2013.01); *H01L 24/13* (2013.01)

(58) Field of Classification Search
CPC ........... H01L 23/5384; H01L 21/76841; H01L 21/76879; H01L 24/13
USPC ...................................................... 257/774
See application file for complete search history.

(56) References Cited

U.S. PATENT DOCUMENTS

| | | |
|---|---|---|
| 4,707,218 A | 11/1987 | Giammarco et al. |
| 6,716,747 B2 | 4/2004 | Uesawa |
| 6,858,542 B2 | 2/2005 | Sparks et al. |
| 7,741,226 B2 | 6/2010 | Andry et al. |
| 8,043,973 B2 | 10/2011 | Goodlin et al. |

(Continued)

FOREIGN PATENT DOCUMENTS

| | | |
|---|---|---|
| JP | 2007-266519 A | 10/2007 |
| KR | 10-2015-0019089 A | 2/2015 |

(Continued)

*Primary Examiner* — Calvin Choi
(74) *Attorney, Agent, or Firm* — Ward and Smith, P.A.

(57) ABSTRACT

Integrated circuit (IC) devices are provided including a substrate having a first sidewall defining a first through hole that is a portion of a through-silicon via (TSV) space, an interlayer insulating layer having a second sidewall and a protrusion, wherein the second sidewall defines a second through hole providing another portion of the TSV space and communicating with the first through hole, and the protrusion protrudes toward the inside of the TSV space and defines an undercut region in the first through hole, a TSV structure penetrating the substrate and the interlayer insulating layer and extending through the first through hole and the second through hole, and a via insulating layer surrounding the TSV structure in the first through hole and the second through hole.

25 Claims, 32 Drawing Sheets

(56) References Cited

U.S. PATENT DOCUMENTS

| | | | |
|---|---|---|---|
| 8,178,950 B2 * | 5/2012 | Dao | H01L 21/76847 257/621 |
| 8,264,066 B2 | 9/2012 | Lo et al. | |
| 8,329,578 B2 | 12/2012 | Chang et al. | |
| 8,394,718 B1 * | 3/2013 | Gambino | H01L 21/3081 257/E21.578 |
| 8,487,425 B2 | 7/2013 | Andry et al. | |
| 8,609,529 B2 * | 12/2013 | Lin | H01L 21/76898 257/E21.549 |
| 9,219,035 B2 | 12/2015 | Lee et al. | |
| 9,287,251 B2 | 3/2016 | Kang et al. | |
| 9,343,361 B2 | 5/2016 | Lee et al. | |
| 2014/0327151 A1 * | 11/2014 | Yang | H01L 21/76898 257/774 |
| 2015/0093896 A1 | 4/2015 | Lee et al. | |
| 2015/0137388 A1 * | 5/2015 | Kim | H01L 23/481 257/774 |
| 2015/0228555 A1 * | 8/2015 | Rabie | H01L 23/481 257/774 |
| 2016/0155686 A1 | 6/2016 | Lee et al. | |
| 2016/0163590 A1 | 6/2016 | Jung et al. | |

FOREIGN PATENT DOCUMENTS

| | | |
|---|---|---|
| KR | 10-2015-0057787 A | 5/2015 |
| KR | 10-2016-0010081 A | 1/2016 |
| KR | 10-2016-0065631 A | 6/2016 |
| KR | 10-2016-0067517 A | 6/2016 |

* cited by examiner

INTEGRATED CIRCUIT DEVICES HAVING THROUGH-SILICON VIA STRUCTURES AND METHODS OF MANUFACTURING THE SAME

CROSS-REFERENCE TO RELATED APPLICATION

This application claims the benefit of Korean Patent Application No. 10-2015-0115413, filed on Aug. 17, 2015, in the Korean Intellectual Property Office, the disclosure of which is incorporated herein by reference as if set forth in its entirety.

FIELD

The inventive concept relates generally to integrated circuit (IC) devices, and more particularly, to IC devices having a through-silicon via (TSV) structure and methods of manufacturing the same.

BACKGROUND

Due to the rapid development of a three-dimensional (3D) package technique of mounting a plurality of semiconductor chips in a single semiconductor package, a through-silicon via (TSV) technique for forming a vertical electrical connection through a substrate or a die is being discussed. To improve performance and reliability of a 3D package, a device forming technique for reducing the likelihood that a TSV structure and elements located around the TSV structure will be damaged or degraded during the formation of the TSV structure so as to obtain stable operating characteristics and high reliability is being discussed.

SUMMARY

Some embodiments of the inventive concept provide an integrated circuit (IC) device, which may reduce the likelihood of damage to or degradation of a through-silicon via (TSV) structure and elements located around the TSV structure, and provide stable operating characteristics and high reliability.

Further embodiments of the present inventive concept provide methods of manufacturing an IC device, which may reduce the likelihood of a TSV structure and elements located around the TSV structure from being damaged or degraded due to process atmospheres.

Still further embodiments of the inventive concept provide an IC device including a substrate having a first sidewall defining a first through hole that is a portion of a TSV space. An interlayer insulating layer has a second sidewall and a protrusion. The second sidewall defines a second through hole providing another portion of the TSV space and communicating with the first through hole. The protrusion protrudes toward the inside of the TSV space and defines an undercut region in the first through hole. A TSV structure penetrates the substrate and the interlayer insulating layer and extends through the first through hole and the second through hole. A via insulating layer surrounds the TSV structure in the first through hole and the second through hole.

In some embodiments, the second sidewall may have an inclined sidewall portion.

In further embodiments, a width of at least a portion of the second through hole may gradually increase away from the substrate.

In still further embodiments, in the IC device, the second sidewall may have an inclined sidewall portion, and an angle formed between a bottom surface of the interlayer insulating layer and the inclined sidewall portion in the protrusion may range from about 75° to 85°.

In some embodiments, a horizontal distance from a central portion of the TSV space to the protrusion may be less than a horizontal distance from the central portion of the TSV space to the first sidewall.

In further embodiments, a width of an end portion of the second through hole nearer to the substrate than to the interlayer insulating layer may be less than a width of an end portion of the first through hole nearer to the interlayer insulating layer than to the substrate.

In still further embodiments, in the IC device, the via insulating layer may include a protrusion region located in the undercut region. The protrusion region of the via insulating layer may be in contact with a bottom surface of the interlayer insulating layer.

In some embodiments, the substrate may include a protrusion having an inclined sidewall. The inclined sidewall may be a portion of the first sidewall, which is adjacent to the interlayer insulating layer.

In further embodiments, a first portion of the via insulating layer covers the first sidewall in the undercut region, and a second portion of the via insulating layer covers the protrusion in the second through hole. A width of the first portion in a horizontal direction may be greater than a width of the second portion in the horizontal direction.

In still further embodiments, the interlayer insulating layer may include a multilayered structure including a plurality of stacked insulating layers. The second sidewall may include a first surface portion having a corrugated shape. The via insulating layer may include a second surface portion that contacts the first surface portion and has a corrugated shape corresponding to the corrugated shape of the first surface portion.

In some embodiments, the interlayer insulating layer may include a first insulating layer and a second insulating layer. The first insulating layer may include a different material from a material included in the second insulating layer. A first width of a portion of the second through hole, which is defined by the first insulating layer, in a horizontal direction, may be different from a second width of a portion of the second through hole, which is defined by the second insulating layer, in the horizontal direction. The via insulating layer may include a first outer wall portion contacting the first insulating layer and a second outer wall portion contacting the second insulating layer. A horizontal distance between the TSV structure and the first outer wall portion may be different from a horizontal distance between the TSV structure and the second outer wall portion.

In further embodiments, in the IC device, the TSV structure may include a conductive plug penetrating the substrate and the interlayer insulating layer, and a conductive barrier layer surrounding the conductive plug in the first through hole and the second through hole. Each of the conductive plug and the conductive barrier layer may include a concave portion facing the protrusion and recessed toward a central portion of the TSV space.

In still further embodiments, the IC device may further include a front-end-of-line (FEOL) structure formed on the substrate, and a back-end-of-line (BEOL) structure formed on the FEOL structure. The FEOL structure may include the interlayer insulating layer, and the BEOL structure may cover the TSV structure and the interlayer insulating layer.

In some embodiments, the IC device may further include an FEOL structure formed on the substrate, and a BEOL structure formed on the FEOL structure. The TSV structure may penetrate the FEOL structure and the BEOL structure.

Further embodiments of the present inventive concept provide an IC device including semiconductor structures including a substrate and an interlayer insulating layer. The interlayer insulating layer is formed on the substrate and has a sidewall having an inclined sidewall portion. A TSV structure penetrates the substrate and the interlayer insulating layer. A via insulating layer penetrates the substrate and the interlayer insulating layer and surrounds the TSV structure. The via insulating layer includes a protrusion region facing an interface portion between the substrate and the interlayer insulating layer and an inclined surface contacting the inclined sidewall portion.

In still further embodiments, in the IC device, an angle formed between a bottom surface of the interlayer insulating layer and the inclined sidewall portion may range from about 75° to about 85°.

In some embodiments, the interlayer insulating layer may include a protrusion, which protrudes toward the inside of the TSV structure. The protrusion region of the via insulating layer may be in contact with the protrusion.

In further embodiments, the inclined sidewall portion may include a surface portion having a corrugated shape.

In still further embodiments, in the IC device, the substrate may have a first surface portion having a corrugated shape, which faces the via insulating layer. The via insulating layer may have a second surface portion that contacts the first surface portion and has a corrugated shape corresponding to the first surface portion.

Some embodiments of the present inventive concept provide a method of manufacturing an IC device including forming an interlayer insulating layer on a substrate and etching the interlayer insulating layer and the substrate and forming a first through hole in the substrate and a second through hole in the interlayer insulating layer. The first through hole is a portion of the TSV space and is defined by a first sidewall of the substrate. The second through hole is another portion of the TSV space and is defined by a second sidewall of the interlayer insulating layer. The second sidewall has an inclined sidewall portion. A via insulating layer is formed in the first through hole and the second through hole. The via insulating layer contacts the first sidewall and the inclined sidewall portion of the second sidewall. A TSV structure is formed in the via insulating layer in the first through hole and the second through hole.

In further embodiments, the method may further include forming a protrusion and an undercut region during the forming of the first through hole and the forming of the second through hole. The protrusion may protrude toward the inside of the TSV space in the interlayer insulating layer, and the undercut may be formed in the first through hole under the protrusion.

In still further embodiments, the protrusion may be formed such that an angle formed between a bottom surface of the interlayer insulating layer and the inclined sidewall portion ranges from about 75° to about 85°.

In some embodiments, the formation of the via insulating layer may include forming a protrusion region contacting a bottom surface of the interlayer insulating layer in the undercut region.

In further embodiments, the formation of the TSV structure may include forming a conductive barrier layer on the via insulating layer, the conductive barrier layer penetrating the substrate and the interlayer insulating layer, and forming a conductive plug on the conductive barrier layer, the conductive plug penetrating the substrate and the interlayer insulating layer. Each of the conductive plug and the conductive barrier layer may include a concave portion facing the protrusion and recessed toward a central portion of the TSV space.

In still further embodiments, a width of the second through hole may gradually increase away from the substrate.

In some embodiments, the interlayer insulating layer may include a multilayered structure including a plurality of stacked insulating layers. The method may further include forming a surface portion having a corrugated shape in the inclined sidewall portion during the forming of the second through hole.

In further embodiments, the method may further include forming a surface portion having a non-flat portion in the first sidewall of the substrate during the forming of the first through hole.

Still further embodiments of the present inventive concept provide a method of manufacturing an IC device including forming a substrate and an interlayer insulating layer, wherein the substrate has a first sidewall defining a portion of a TSV space. The interlayer insulating layer has a second sidewall defining another portion of the TSV space and a protrusion protruding toward the inside of the TSV space and defines an undercut region in the TSV space. A via insulating layer is formed to penetrate the substrate and the interlayer insulating layer. The via insulating layer includes a protrusion region contacting a bottom surface of the interlayer insulating layer in the undercut region. A TSV structure is formed on the via insulating layer. The TSV structure penetrates the substrate and the interlayer insulating layer.

In some embodiments, the formation of the interlayer insulating layer may include forming an inclined sidewall portion of the second sidewall. The inclined sidewall portion may be formed such that an angle formed between the bottom surface of the interlayer insulating layer and the inclined sidewall portion in the protrusion ranges from about 75° to about 85°.

In further embodiments, the method may further include forming a surface portion having a corrugated shape on the second sidewall of the interlayer insulating layer.

In still further embodiments, the formation of the via insulating layer may include forming a first portion of the via insulating layer covering the first sidewall in the undercut region, and forming a second portion of the via insulating layer covering the protrusion on the second sidewall. A width of the second portion of the via insulating layer in a horizontal direction may be less than a width of the first portion in the horizontal direction.

Some embodiments of the present inventive concept provide IC devices including a substrate having a first sidewall defining a first through hole that is a portion of a through-silicon via (TSV) space; an interlayer insulating layer having a second sidewall and a protrusion, wherein the second sidewall defines a second through hole providing another portion of the TSV space and coupled to the first through hole; wherein the protrusion protrudes toward an inside of the TSV space and defines an undercut region in the first through hole; wherein the second sidewall has an inclined sidewall portion; and wherein in the protrusion, an angle formed between a bottom surface of the interlayer insulating layer and the inclined sidewall portion of the second sidewall ranges from about 75° to about 85°.

In further embodiments, the IC device may further include a TSV structure extending into the substrate and the interlayer insulating layer and through the first through hole and the second through hole; and a via insulating layer surrounding the TSV structure in the first through hole and the second through hole.

In still further embodiments, the via insulating layer may further include a protrusion region located in the undercut region.

In some embodiments, a horizontal distance from a central portion of the TSV space to the protrusion may be less than a horizontal distance from the central portion of the TSV space to the first sidewall.

In further embodiments, a width of an end portion of the second through hole nearer to the substrate than to the interlayer insulating layer is less than a width of an end portion of the first through hole nearer to the interlayer insulating layer than to the substrate.

BRIEF DESCRIPTION OF THE DRAWINGS

Some embodiments of the inventive concept will be more clearly understood from the following detailed description taken in conjunction with the accompanying drawings in which.

DETAILED DESCRIPTION OF THE EMBODIMENTS

Figure 1A:
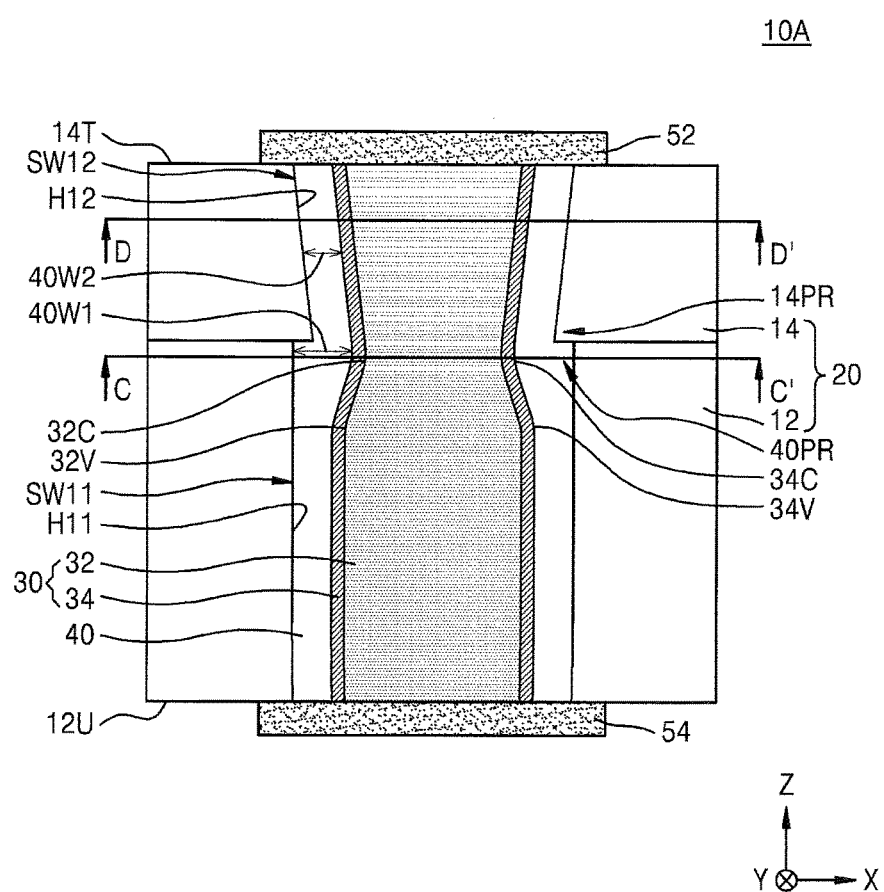
FIG. 1A is a cross-section of an integrated circuit (IC) device according to some embodiments of the present inventive concept.

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which example embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. Like reference numerals in the drawings denote like elements, and thus descriptions thereof will be omitted.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

Unless defined otherwise, all terms used herein including technical or scientific terms have the same meanings as those generally understood by those of ordinary skill in the art to which the present inventive concept may pertain. The terms as those defined in generally used dictionaries are construed to have meanings matching that in the context of related technology and, unless clearly defined otherwise, are not construed to be ideally or excessively formal.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. When a term "substrate" is used herein, it should be understood as either the substrate itself or both the substrate and a stack structure including a predetermined layer or film formed on the substrate. Furthermore, when an expression "surface of the substrate" is used herein, it should be understood as either as an exposed surface of the substrate itself or an outer surface of a predetermined layer or film formed on the substrate.

Referring first to FIG. 1A, a cross-section of an integrated circuit (IC) device 10A according to some embodiments of the present inventive concept will be discussed. As illustrated in FIG. 1A, the IC device 10A may include a semiconductor structure 20 including a substrate 12 and an interlayer insulating layer 14 formed on the substrate 12, a through-silicon via (TSV) structure 30 penetrating the substrate 12 and the interlayer insulating layer 14, and a via insulating layer 40 penetrating the substrate 12 and the interlayer insulating layer 14 and surrounding the TSV structure 30.

The TSV structure 30 may include a conductive plug 32 penetrating the substrate 12 and the interlayer insulating layer 14 and a conductive barrier layer 34 configured to surround the conductive plug 32.

Figure 1B:
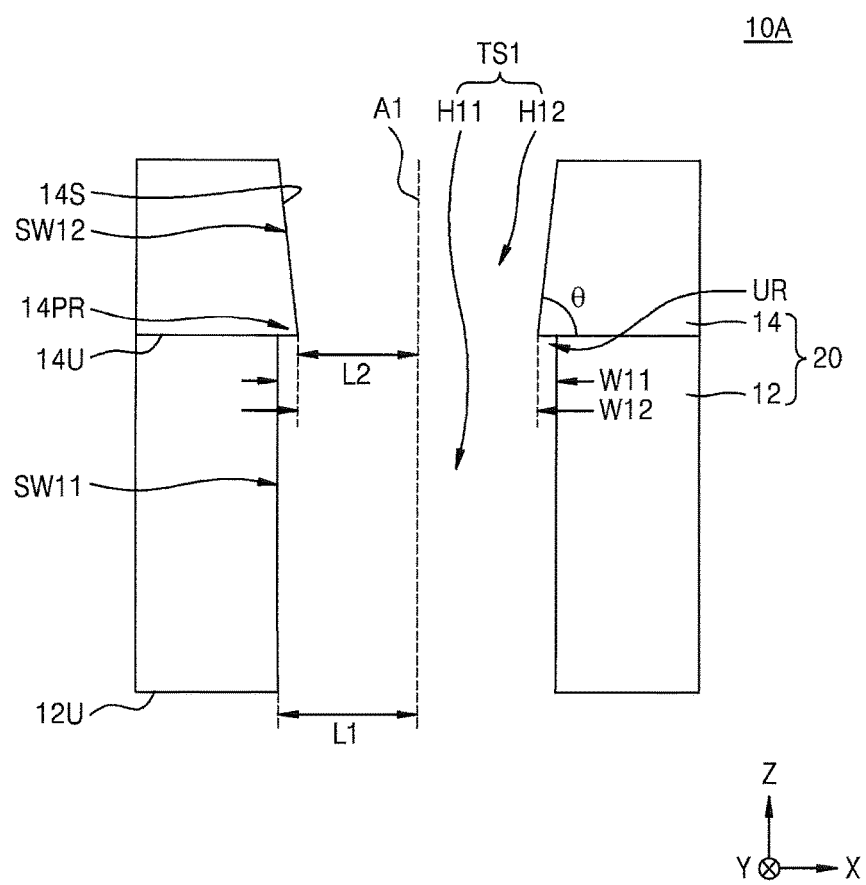
FIG. 1B is a cross-section of some elements of a substrate and an interlayer insulating layer of the IC device illustrated in FIG. 1A.
Figure 1C:
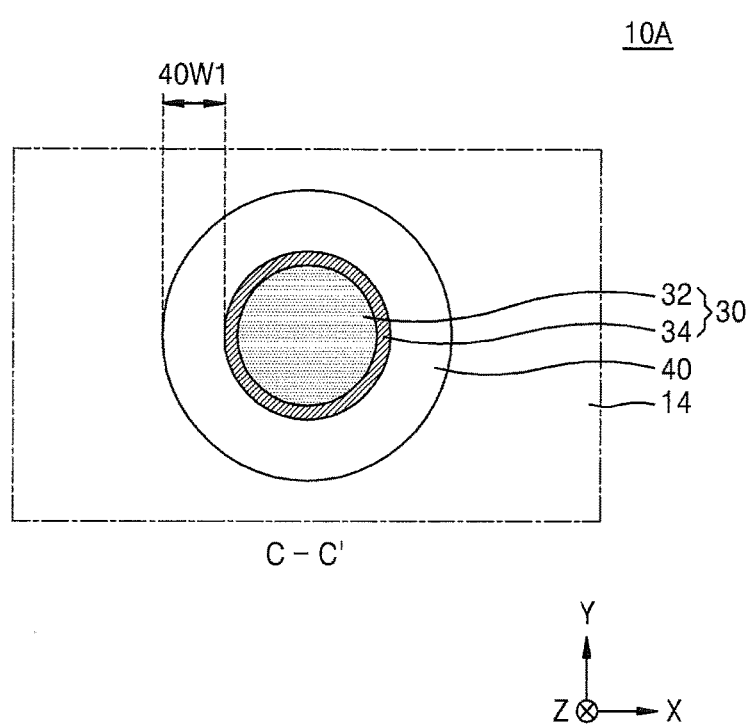
FIG. 1C is a cross-section taken along a line C-C' of FIG. 1A.
Figure 1D:
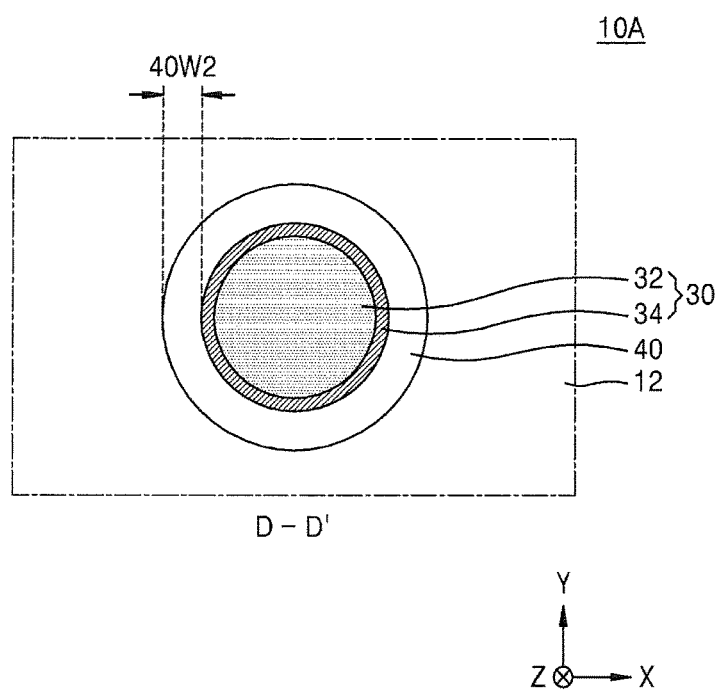
FIG. 1D is a cross-section taken along a line D-D' of FIG. 1A.

FIG. 1B is a cross-section of some elements of the substrate 12 and the interlayer insulating layer 14 of the IC device 10A illustrated in FIG. 1A. FIG. 1C is a cross-section taken along a line C-C' of FIG. 1A. FIG. 1D is a cross-section taken along a line D-D' of FIG. 1A. Referring to FIGS. 1A to 1D, the substrate 12 may have a first sidewall SW11 defining a first through hole H11 that is a portion of a TSV space in which the TSV structure 30 and the via insulating layer 40 are contained.

The interlayer insulating layer 14 may have a second sidewall SW12 defining a second through hole H12 that is another portion of the TSV space TS1. The second through hole H12 may communicate with the first through hole H11. Furthermore, the interlayer insulating layer 14 may have a protrusion 14PR, which may protrude toward the inside of the TSV space TS1 and define an undercut region UR (refer to FIG. 1B) in the first through hole H11 of the substrate 12. The protrusion 14PR may protrude toward the TSV structure 30 formed in the TSV space TS1.

By forming the undercut region UR in the TSV space TS1, surface areas of the TSV structure 30 and the via insulating layer 140 surrounding the TSV structure 30 may increase in the vicinity of the undercut region UR, and the increased surface areas may serve to release stress caused by the TSV structure 30 and the vicinity thereof. Thus, the likelihood of the occurrence of delamination defects may be reduced, or possibly prevented, in the TSV structure 30 and the vicinity thereof due to the undercut region UR formed in the TSV space TS1.

A width W12 of an end portion nearer to the substrate 12 than the other end portion of both end portions of the second through hole H12 may be less than a width W11 of an end portion nearer to the interlayer insulating layer 14 than the other end portion of both end portions of the first through hole H11.

The TSV structure 30 may penetrate the substrate 12 and the interlayer insulating layer 14 and extend through the first through hole H11 and the second through hole H12.

The second sidewall SW12 may include an inclined sidewall portion 14S. Thus, a width of at least a portion of the second through hole H12 in a horizontal direction (X direction) may gradually increase away from the substrate 12.

In the protrusion 14PR of the interlayer insulating layer 14, an angle θ formed between a bottom surface 14U of the interlayer insulating layer 14 and the inclined sidewall portion 14S may be selected in the range of about 75° to about 85°.

A width of a portion of the TSV space TS1 that is defined by the protrusion 14PR of the interlayer insulating layer 14 in the horizontal direction (X direction) may be less than a width of a portion of the TSV space TS1 that is defined by the first sidewall SW11 of the substrate 12 in the horizontal direction (X direction). Thus, a horizontal distance L2 from a central portion A1 of the TSV space TS1 illustrated with a dotted line in FIG. 1B to the protrusion 14PR may be less than a horizontal distance L1 from the central portion A1 of the TSV space TS1 to the first sidewall SW11.

As illustrated in FIGS. 1A, 1C, and 1D, the via insulating layer 40 may be formed to surround the TSV structure 30 in the first through hole H11 and the second through hole H12.

The via insulating layer 40 may include a protrusion region 40PR, which may contact the bottom surface 14U of the interlayer insulating layer 14 in the undercut region UR. The protrusion region 40PR may face an interfacial portion between the substrate 12 and the interlayer insulating layer 14 and contact the protrusion 14PR of the interlayer insulating layer 14.

A thickness of the protrusion region 40PR of the via insulating layer 40 in a horizontal direction (X direction) may be greater than thicknesses of other portions of the via insulating layer 40 in the horizontal direction. For example, a width 40W1 of the protrusion region 40PR of the via insulating layer 40, which covers the first sidewall SW11 of the substrate 12 in the undercut region UR, in the horizontal direction (X direction) may be greater than a width 40W2 of a portion of the interlayer insulating layer 14, which covers the protrusion 14PR in the second through hole H12, in the horizontal direction (X direction).

As illustrated in FIG. 1A, the conductive plug 32 and the conductive barrier layer 34 included in the TSV structure 30 may extend through the first through hole H11 and the second through hole H12 and penetrate the substrate 12 and the interlayer insulating layer 14.

The conductive plug 32 may include a concave portion 32C and a convex portion 32V, and the conductive barrier layer 34 may include a concave portion 34C and a convex portion 34V. The concave portions 32C and 34C may be located in portions that face the protrusion 14PR around the protrusion 14PR of the interlayer insulating layer 14. The concave portions 32C and 34C may be recessed toward the central portion A1 of the TSV space TS1. The convex portions 32V and 34V may be located in portions that face the substrate 12 under the protrusion 13PR of the interlayer insulating layer 14. The convex portions 32V and 34V may protrude in a direction far away from the central portion A1 of the TSV space TS1.

In some embodiments, the substrate 12 may include a semiconductor, for example, silicon (Si) and germanium (Ge), or a compound semiconductor, for example, silicon carbide (SiC), gallium arsenide (GaAs), indium arsenide (InAs), and indium phosphide (InP). In some embodiments, the substrate 12 may have a silicon on insulator (SOI) structure. For example, the substrate 12 may include a buried oxide (BOX) layer. In some embodiments, the substrate 12 may include a conductive region, for example, a doped well or a doped structure. Furthermore, the substrate 12 may have one of various device isolation structures, such as a shallow trench isolation (STI) structure.

In some embodiments, the interlayer insulating layer 14 may be an interlayer insulating layer formed in a front-end-of-line (FEOL) structure formed on the substrate 12. In some embodiments, the interlayer insulating layer 14 may include a first interlayer insulating layer included in the FEOL structure formed on the substrate 12, and a second interlayer insulating layer included in a back-end-of-line (BEOL) structure formed on the FEOL structure.

The via insulating layer 40 may extend over the entire lengths of the first through hole H11 and the second through hole H12. The conductive plug 32 of the TSV structure 30 may include a first metal, and the conductive barrier layer 34 may include a different metal from the first metal.

In some embodiments, the conductive plug 32 may include copper (Cu) or tungsten (W). For example, the conductive plug 32 may include copper (Cu), copper tin (CuSn), copper magnesium (CuMg), copper nickel (CuNi), copper zinc (CuZn), copper palladium (CuPd), copper gold (CuAu), copper tungsten (CuW), tungsten (W), or an W alloy. However, it will be understood that embodiments of the present inventive concept are not limited to this configuration.

The conductive barrier layer 34 may contact a sidewall of the conductive plug 32 and surround the conductive plug 32. The conductive barrier layer 34 may include a conductive layer having a relatively low interconnection resistance. For example, the conductive barrier layer 34 may be a single layer or multilayered structure including at least one selected from the group consisting of tungsten (W), tungsten nitride (WN), titanium (Ti), titanium nitride (TiN), tantalum (Ta), tantalum nitride (TaN), and ruthenium (Ru). For example, the conductive barrier layer 34 may be a multilayered structure including TaN/W, TiN/W, or WN/W. The conductive barrier layer 34 may have a thickness of about 500 Å to about 1000 Å.

In some embodiments, the conductive barrier layer 34 may have a roughly uniform thickness in a lengthwise direction (Z direction) of the TSV structure 30. In some embodiments, the conductive barrier layer 34 may be formed by using a physical vapor deposition (PVD) process or a chemical vapor deposition (CVD) process. In some embodiments, the conductive barrier layer 34 may be formed by using an atomic layer deposition (ALD) process.

In some embodiments, the conductive barrier layer 34 may have a gradually smaller thickness from a top surface 14T of the interlayer insulating layer 14 of the semiconductor structure 20 toward a rear surface of the substrate 12. For example, a portion of the conductive barrier layer 34 near to the top surface 14T of the interlayer insulating layer 14 in the TSV space TS1 may have a thickness of about 100 Å to about 1000 Å, while a portion of the conductive barrier layer 34 near to the rear surface 12U of the substrate 12 in the TSV space TS1 may have a thickness of about 0 Å to about 50 Å. The conductive barrier layer 34, which has a variable thickness in a lengthwise direction of the TSV space TS1, may be formed by using a PVD process.

The via insulating layer 40 may serve to separate the semiconductor structure 20 from the TSV structure 30. The via insulating layer 40 may include, for example, an oxide layer, a nitride layer, a carbide layer, a polymer, or a combination thereof. In some embodiments, the via insulating layer 40 may be formed by using a CVD process. The via insulating layer 40 may be formed to a thickness of about 500 Å to about 2500 Å.

Conductive layers 52 and 54 may be formed on the top surface 14T of the interlayer insulating layer 14 and the rear surface 12U of the substrate 12, respectively, among the semiconductor structure 20, and connected to the TSV structure 30.

FIGS. 1C and 1D illustrate an example in which the TSV structure 30 and the via insulating layer 40 have approximately circular sectional shapes, however, embodiments of the present inventive concept are not limited to this configuration. For example, a planar structure of each of the TSV structure 30 and the via insulating layer 40 may have various sectional shapes, such as a polygonal sectional shape and an elliptical sectional shape.

Figure 2:
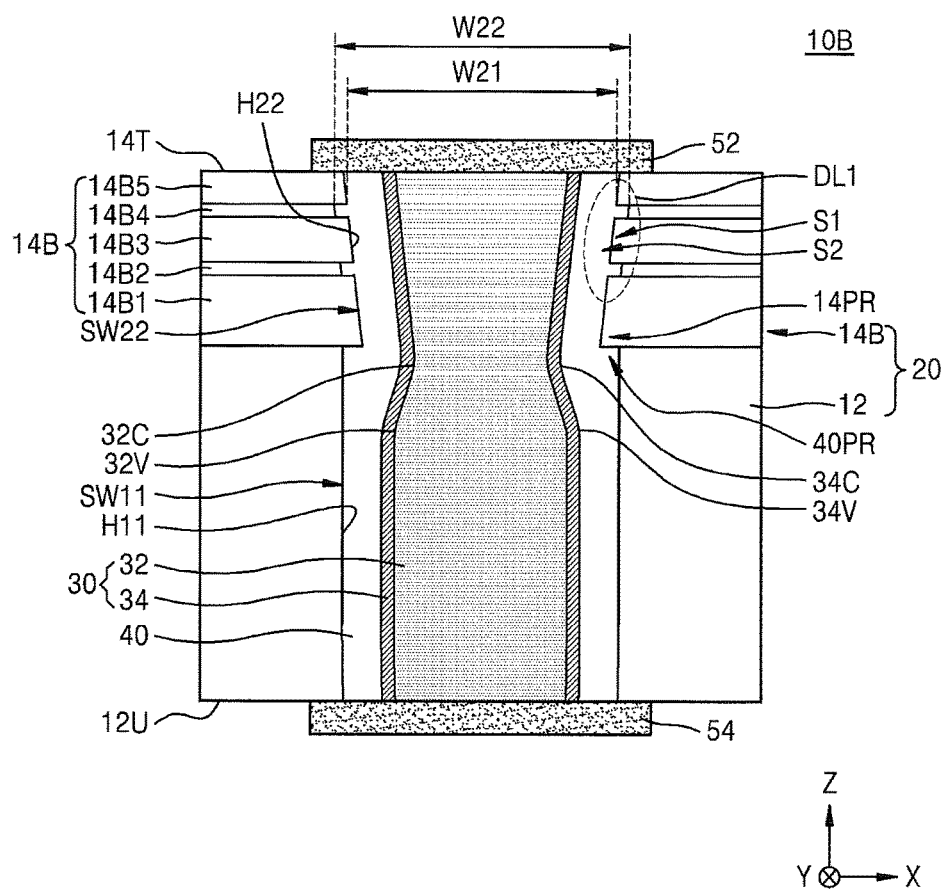
FIG. 2 is a cross-section of an IC device according to some embodiments of the present inventive concept.

Referring now to FIG. 2, a cross-section of an IC device 10B according to some embodiments will be discussed. In FIG. 2, the same elements are used to denote the same elements as in FIGS. 1A to 1D, and thus detailed associated therewith will be omitted in the interest of brevity.

The IC device 10B illustrated in FIG. 2 may have generally the same configuration as the IC device 10A illustrated in FIGS. 1A to 1D. However, the IC device 10B may include an interlayer insulating layer 14B having a multi-layered structure formed by stacking a plurality of insulating layers, for example, first to fifth insulating layers 14B1, 14B2, 14B3, 14B4, and 14B5 instead of the interlayer insulating layer 14 of the IC device 10A illustrated in FIGS. 1A to 1D.

End portions of the insulating layers 14B1, 14B2, 14B3, 14B4, and 14B5, which are exposed by the second through hole H22 may be located in different locations. Thus, as in a region illustrated with a dotted line DL1 in FIG. 2, a second sidewall SW22 of the interlayer insulating layer 14B may include a first surface portion S1 having a corrugated shape. A portion of the via insulating layer 40, which faces the second sidewall SW22, may have a second surface portion S2 having a corrugated shape corresponding to the corrugated shape of the first surface portion S1.

In some embodiments, the insulating layers 14B1, 14B2, 14B3, 14B4, and 14B5 may include two insulating layers including different materials.

In some embodiments, at least some of the plurality of insulating layers 14B1, 14B2, 14B3, 14B4, and 14B5 may include different materials. In some embodiments, among the plurality of insulating layers 14B1, 14B2, 14B3, 14B4, and 14B5, the first, third, and fifth insulating layers 14B1, 14B3, and 14B5 may include an oxide layer, and the second and fourth insulating layers 14B2 and 14B4 may include a nitride layer. For example, each of the first, third, and fifth insulating layers 14B1, 14B3, and 14B5 may include a tetraethylorthosilicate (TEOS) layer, a high-density plasma (HDP) layer, a boro-phospho-silicate glass (BPSG) layer, a flowable chemical vapor deposition (FCVD) oxide layer, or a ultralow-k (ULK) layer having a ultralow dielectric constant K of about 2.2 to about 2.4. The ULK layer may include, for example, a SiOC layer or a SiCOH layer. Furthermore, each of the second and fourth insulating layers 14B2 and 14B4 may include silicon nitride (SiN) or silicon oxynitride (SiON).

A first width W21 of the second through hole H22, which is defined by any one of the first, third, and fifth insulating layers 14B1, 14B3, and 14B5, in the horizontal direction may be different from a second width W22 of a portion of the second through hole H22, which is defined by any one of the second and fourth insulating layers 14B2 and 14B4, in the horizontal direction. Although the second width W22 may be greater than the first width W21 as illustrated in FIG. 2, the inventive concept is not limited to the example illustrated in FIG. 2.

The via insulating layer 40 may include outer wall portions, which contact the first, third, and fifth insulating layers 14B1, 14B3, and 14B5, and outer wall portions, which contact the second and fourth insulating layers 14B2 and 14B4. The outer wall portions that contact the first, third, and fifth insulating layers 14B1, 14B3, and 14B5 may have a horizontal distance (X-directional distance) from the TSV structure 30 from the outer wall portions that contact the second and fourth insulating layers 14B2 and 14B4.

FIG. 2 illustrates an example in which the interlayer insulating layer 14B has a quintuple structure including five insulating layers 14B1, 14B2, 14B3, 14B4, and 14B5, however, embodiments of the present inventive concept are not limited thereto. The interlayer insulating layer 14B may have a multilayered structure including at least two stacked insulating layers, and the number of stacked insulating layers is not specifically limited.

Figure 3A:
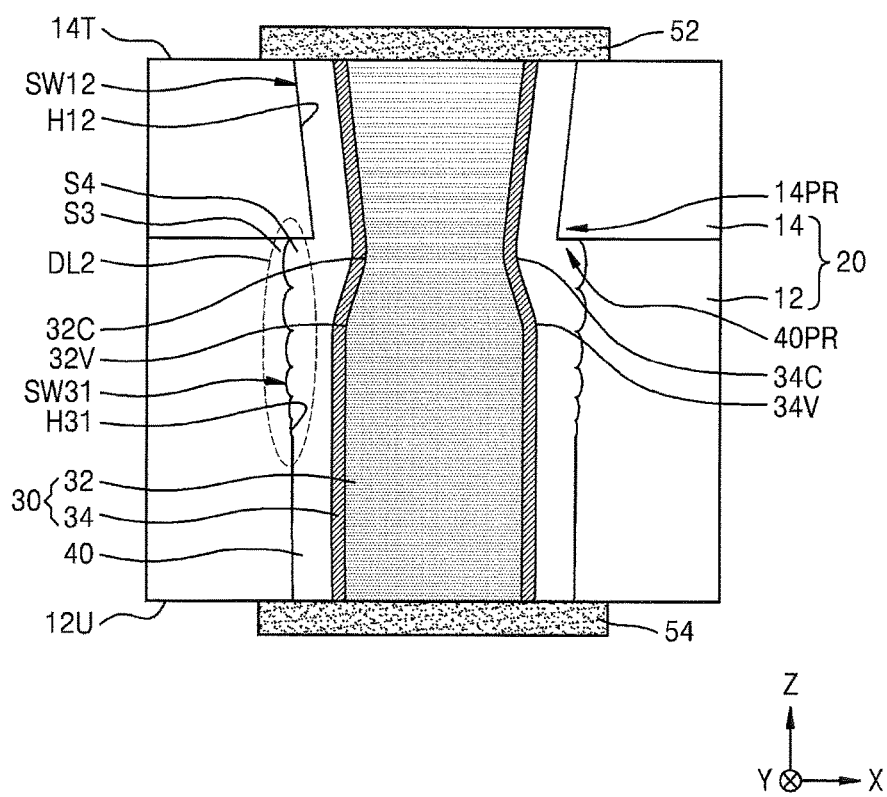
FIGS. 3A to 3C are cross-sections of IC devices according to some embodiments of the present inventive concept.

Referring now to FIG. 3A, a cross-section of an IC device 10C according to some embodiments of the present inventive concept will be discussed. In FIG. 3A, the same elements are used to denote the same elements as in FIGS. 1A to 1D and, thus, details with respect thereto may be omitted herein in the interest of brevity.

The IC device 10C illustrated in FIG. 3A may have generally the same configuration as the IC device 10A illustrated in FIGS. 1A to 1D except that a third surface portion S3 having a non-flat portion is formed in a first sidewall SW31 of a substrate 12 defining a first through hole H31 as in a region illustrated with a dotted line DL2 in FIG. 3A. The third surface portion S3 having the non-flat portion may be formed in the first sidewall SW31 during a process of forming the first through hole H31 in the substrate 12. In some embodiments, a bosch process may be used to form the first through hole H31 that is defined by the first sidewall SW31 in which the third surface portion S3 having the non-flat portion is formed. For example, the formation of the first through hole H31 in the substrate 12 may include repeating an inductive coupled plasma (ICP) deep reactive ion etching (DRIE) process using $O_2$ plasma and a sidewall passivation process using any one a CFx-based gas, such as $C_4F_8$, several times. As a result, as illustrated in FIG. 3A, the first through hole H31, which is defined by the first sidewall SW31 in which the third surface portion S3 having the non-flat portion is formed, may be formed.

Furthermore, as in the region illustrated with the dotted line DL1 in FIG. 3A, a fourth surface portion S4 having a non-flat portion having a shape corresponding to the third surface portion S3 having the non-flat portion may be formed in a portion of the via insulating layer 40, which may be in contact with the third surface portion S3 having the non-flat portion, which is included in the first sidewall SW31 of the substrate 12.

Sizes of corrugated portions formed in the non-flat portions of the third surface portion S3 and the fourth surface portion S4 may be gradually reduced from the protrusion 14PR of the interlayer insulating layer 14 toward a rear surface 12U of the substrate 12. Thus, the third surface portion S3 and the fourth surface portion S4 may gradually get flatter toward the rear surface 12U of the substrate 12. In some embodiments, in the first sidewall SW31 of the substrate 12 defining the first through hole H31, the third surface portion S3 having the non-flat portion may be formed only in a partial region adjacent to the interlayer insulating layer 14, and a portion of the first sidewall SW31 adjacent to the rear surface 12U of the substrate 12 may have a flat surface.

Figure 3B:
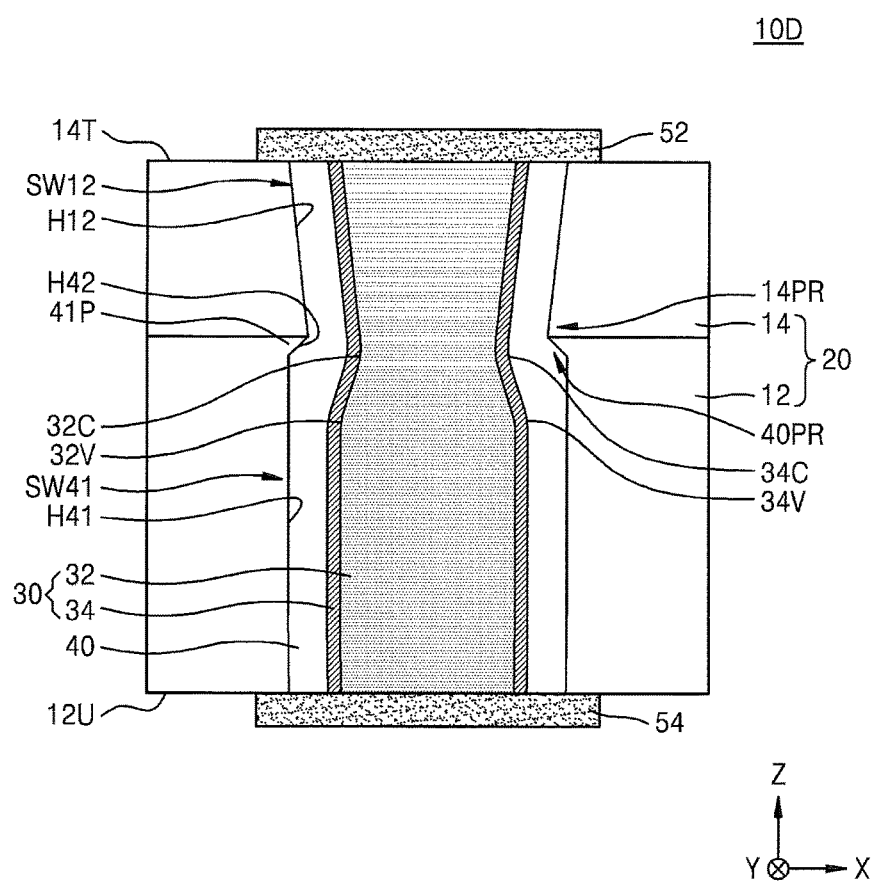

FIG. 3B is a cross-section of an IC device 10D according to some embodiments of the present inventive concept. In FIG. 3B, the same elements are used to denote the same elements as in FIGS. 1A to 1D and, thus, detailed descriptions thereof may be omitted in the interest of brevity.

The IC device 10D illustrated in FIG. 3B may have generally the same configuration as the IC device 10A illustrated in FIGS. 1A to 1D except that a first sidewall SW41 of a substrate 12 defines a first through hole H41 and a protrusion 41P having an inclined sidewall H42 is formed in a portion of the first sidewall SW41 adjacent to an interlayer insulating layer 14.

The inclined sidewall H42 of the protrusion 41P may extend from an end portion of a second through hole H12 formed in the interlayer insulating layer 14. Furthermore, the distance between the inclined sidewall H42 of the protrusion 41P and a central portion A1 (refer to FIG. 1B) of the TSV space TS1 may increase as the distance between the inclined sidewall H42 of the protrusion 41P and the interlayer insulating layer 14 increases. Thus, a portion of a protrusion region 40PR of a via insulating layer 40 may be defined by the inclined sidewall H42 of the protrusion 41P. A portion of the via insulating layer 40, which may be in contact with the inclined sidewall H42 of the protrusion 41P may have an inclined outer wall having a shape corresponding to the inclined sidewall H42.

In some embodiments, the protrusion 41P may be interposed between a protrusion region 40PR of the via insulating layer 40 and the interlayer insulating layer 14 so that the protrusion region 40PR of the via insulating layer 40 may not be in contact with the interlayer insulating layer 14.

In some embodiments, a portion of the first sidewall SW41 of the substrate 12 defining the first through hole H41, which is located under the inclined sidewall H42 of the protrusion 41P, may extend approximately vertically.

Figure 3C:
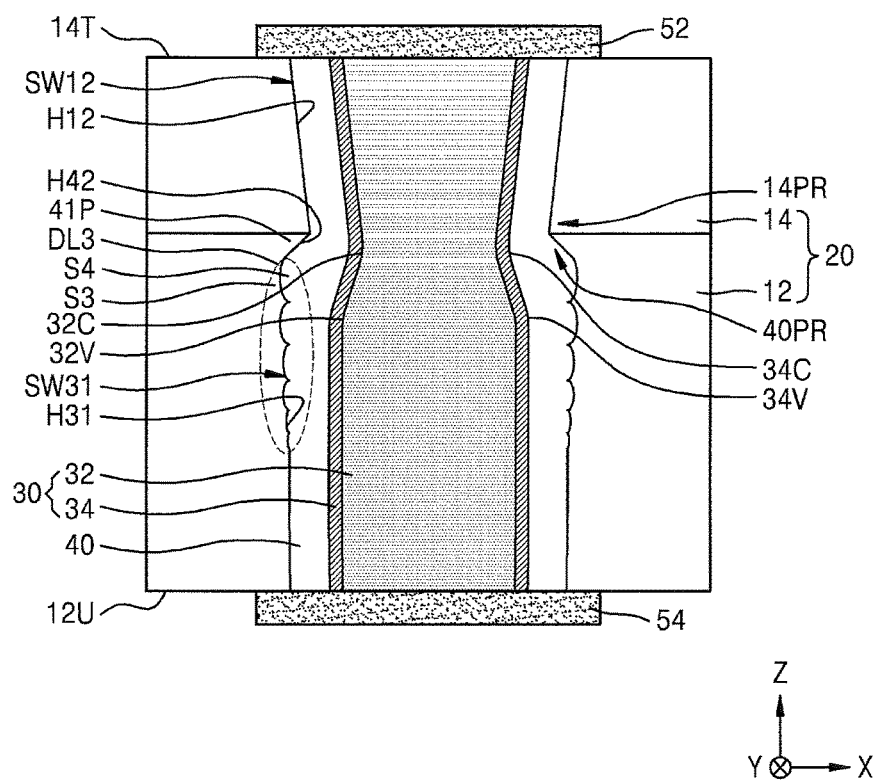

FIG. 3C is a cross-section of an IC device 10E according to some embodiments of the present inventive concept. In FIG. 3C, the same elements are used to denote the same elements as in FIGS. 1A to 3B, and thus detailed descriptions thereof may be omitted in the interest of brevity.

The IC device 10E illustrated in FIG. 3C may have generally the same configuration as the IC device 10D illustrated in FIG. 3B. However, similar to the IC device 10C discussed above with respect to FIG. 3A, a third surface portion S3 having a non-flat portion may be formed in a first sidewall SW31 of a substrate 12 defining a first through hole H31.

The third surface portion S3 may be formed under a protrusion 41P having an inclined sidewall H42 and continuously connected to one end of the inclined sidewall H42.

As in a region illustrated with a dotted line DL3 in FIG. 3C, a portion of a via insulating layer 40, which may be in contact with the inclined sidewall H42 of the protrusion 41P, may have an inclined outer wall having a shape corresponding to the inclined sidewall H42. Furthermore, a fourth surface portion S4 having a non-flat portion having a shape corresponding to the third surface portion S3 may be formed in a portion of the via insulating layer 40, which may be in contact with the third surface portion S3.

Figure 4:
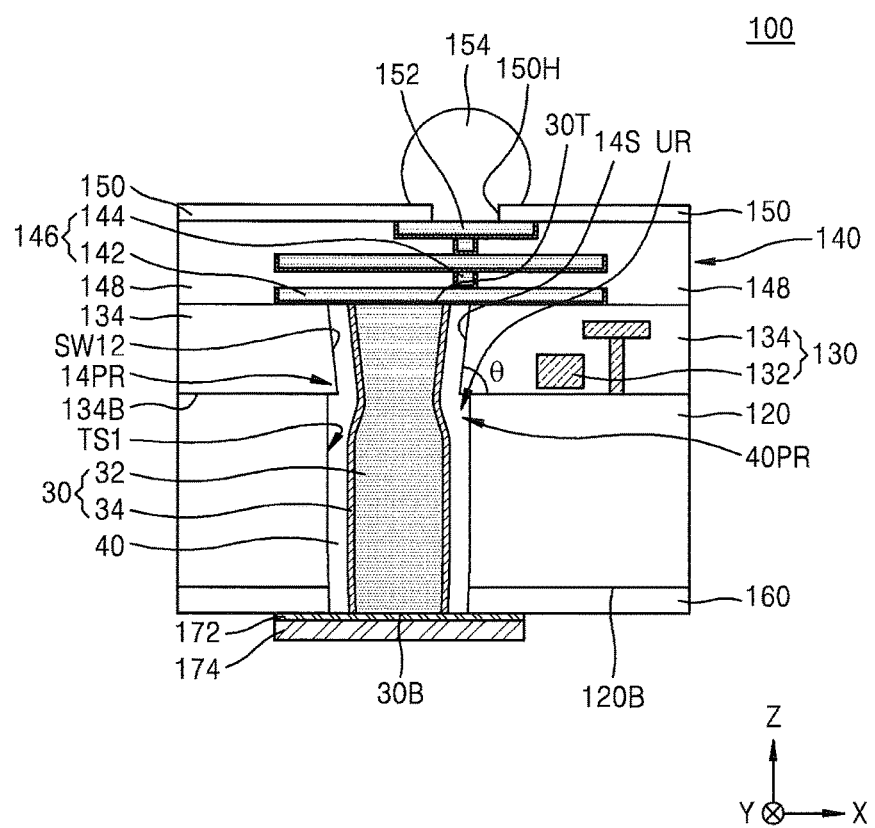
FIG. 4 is a cross-section of an IC device according to some embodiments of the present inventive concept.

FIG. 4 is a cross-section of an IC device 100 according to some embodiments of the present inventive concept. In FIG. 4, the same reference numerals are used to denote the same elements as in FIGS. 1A to 3C and, thus, detailed descriptions thereof are omitted in the interest of brevity.

The IC device 100 may include a substrate 120, a front-end-of-line (FEOL) structure 130, and a back-end-of-line (BEOL) structure 140. A TSV structure 30 may be formed in a TSV space TS1 penetrating the substrate 120 and an interlayer insulating layer 134 of the FEOL structure 130. A via insulating layer 40 may be interposed between the substrate 120 and the TSV structure 30 and between the FEOL structure 130 and the TSV structure 30.

The TSV structure 30 may include a conductive plug 32, which may penetrate the substrate 120 and the interlayer insulating layer 134 of the FEOL structure 130, and a conductive barrier layer 34 configured to surround the conductive plug 32.

Detailed descriptions of the substrate 120 may be the same as those of the substrate 12 of FIGS. 1A to 1D. A bottom surface 120B of the substrate 120 may be covered with a lower insulating layer 160. The lower insulating layer 160 may include a silicon oxide layer, a silicon nitride layer, a polymer, or a combination thereof.

The FEOL structure 130 may include a plurality of individual devices 132 of various kinds and an interlayer insulating layer 134. The plurality of individual devices 132 may include various microelectronic devices, for example, a metal-oxide-semiconductor field effect transistor (MOSFET), a system large scale integration (system LSI), an image sensor such as a CMOS imaging sensor (CIS), a micro-electro-mechanical system (MEMS), an active device, and a passive device. The plurality of individual devices 132 may be electrically connected to a conductive region of the substrate 120. Each of the plurality of individual devices 132 may be electrically insulated from other adjacent individual devices by the interlayer insulating layer 134.

The interlayer insulating layer 134 may have a second sidewall SW12, which may define a portion of the TSV space TS1 and have an inclined sidewall portion 14S. A protrusion 14PR may be formed in the interlayer insulating layer 134 and protrude toward the inside of the TSV space TS1. An undercut region UR may be formed in the TSV space TS1 under the protrusion 14PR of the interlayer insulating layer 134.

In the protrusion 14PR of the interlayer insulating layer 134, an angle θ formed between a bottom surface 134B of the interlayer insulating layer 134 and the inclined sidewall portion 14S may be selected in the range of about 75° to 85°.

The via insulating layer 40, which may surround the TSV structure 30 in the TSV space TS1, may be in contact with an inner sidewall of the TSV space TS1. The via insulating layer 40 may cover a surface of the substrate 120 and a surface of the interlayer insulating layer 134, which are exposed by the TSV space TS1.

The via insulating layer 40 may include a protrusion region 40PR, which may fill the undercut region UR under the protrusion 14PR. By forming the undercut region UR in the TSV space TS1, the TSV structure 30 and the via insulating layer 40 surrounding the TSV structure 30 may include the protrusion region 40PR in the vicinity of the undercut region UR so that a surface area of the via insulating layer 40 may increase. The increased surface area of the via insulating layer 40 may serve to release stress caused by the TSV structure 30 and the vicinity thereof. Thus, the likelihood of delamination defects occurring may be reduce, or possibly prevented, in the TSV structure 30 and the vicinity thereof due to the undercut region UR formed in the TSV space TS1.

The BEOL structure 140 may include a multilayered interconnection structure 146 including a plurality of metal interconnection layers 142 and a plurality of contact plugs 144. The multilayered interconnection structure 146 may be connected to the TSV structure 30.

In some embodiments, the BEOL structure 140 may further include other multilayered interconnection structures formed in other regions of the substrate 120. The other multilayered interconnection structures may include a plurality of metal interconnection layers and a plurality of contact plugs. The BEOL structure 140 may include a plurality of interconnection structures configured to connect individual devices included in the FEOL structure 130 with other interconnections. The multilayered interconnection structure 146 and other interconnection structures included in the BEOL structure 140 may be insulated from one another by a metal interlayer insulating layer 148. In some embodiments, the BEOL structure 140 may further include a seal ring (not shown) configured to protect the multilayered interconnection structure 146 and other structures located thereunder from external shock or moisture.

A top surface 30T of the TSV structure 30 that extends and penetrates the substrate 120 and the FEOL structure 130 may be connected to the metal interconnection layers 142 of the multilayered interconnection structure 146 included in the BEOL structure 140.

An upper insulating layer 150 may be formed on the metal interlayer insulating layer 148. The upper insulating layer 150 may include a silicon oxide layer, a silicon nitride layer, a polymer, or a combination thereof. A hole 150H may be formed in the upper insulating layer 150 and expose a bonding pad 152 connected to the multilayered interconnection structure 146. The bonding pad 152 may be connected to an upper connection terminal 154 via the hole 150H.

A bottom surface 30B of the TSV structure 30 may be covered with a conductive layer 172. A connection terminal 174 may be connected to the TSV structure 30 via the conductive layer 172.

The upper connection terminal 154 and the connection terminal 174 are not limited to example shapes illustrated in FIG. 4. Each of the upper connection terminal 154 and the connection terminal 174 may include a conductive pad, a solder ball, a solder bump, or a redistribution conductive layer. In some embodiments, the upper connection terminal 154 may be omitted from the IC device 100 according to some embodiments.

Each of processes of forming the BEOL structure 140, the upper connection terminal 154, the conductive layer 172, and the connection terminal 174 may be performed after the TSV structure 30 is formed.

The IC device 100 illustrated in FIG. 4 may include an interlayer insulating layer 14B having a second sidewall SW22 including a first surface portion S1 with a corrugated shape as illustrated in FIG. 2 instead of the interlayer insulating layer 134.

The IC device 100 illustrated in FIG. 4 may include the substrate 12 having the first sidewall SW31 including the surface portion S3 with the non-flat portion as illustrated in FIG. 3A, or the substrate 12 having the protrusion 41P as illustrated in FIG. 3B, instead of the substrate 120 illustrated in FIG. 4.

Figure 5:
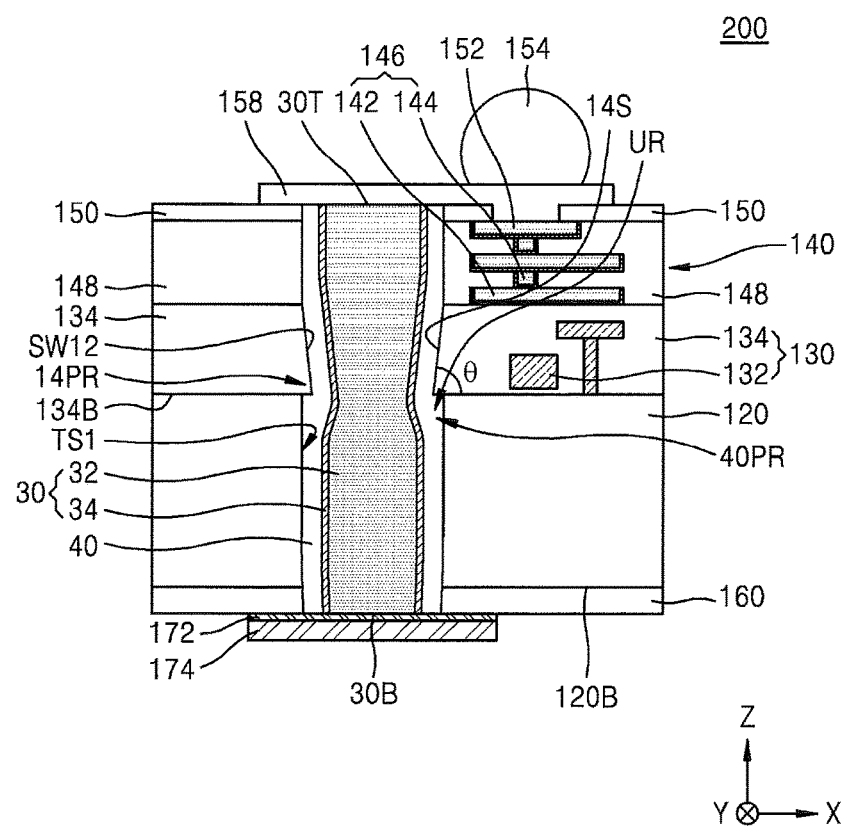
FIG. 5 is a cross-section of an IC device according to some embodiments of the present inventive concept.

FIG. 5 is a cross-section of an IC device 200 according to some embodiments of the present inventive concept. In FIG. 5, the same reference numerals are used to denote the same elements as in FIGS. 1A to 4 and, thus, detailed descriptions thereof are omitted in the interest of brevity.

In the IC device 200, a TSV structure 30 may be formed after an FEOL structure 130 and a BEOL structure 140 are formed. Accordingly, the TSV structure 30 may penetrate a substrate 120, an interlayer insulating layer 134 of the FEOL structure 130, and a metal interlayer insulating layer 148 of the BEOL structure 140. A conductive barrier layer 34 of the TSV structure 30 may include a first outer wall portion surrounded with the substrate 120, a second outer wall portion surrounded with the interlayer insulating layer 134, and a third outer wall portion surrounded with the metal interlayer insulating layer 148.

To electrically connect the TSV structure 30 with an upper connection terminal 154, an upper interconnection 158 may extend on the BEOL structure 140 between the TSV structure 30 and the upper connection terminal 154. The TSV structure 30 may be connected to the upper interconnection 158 through an upper insulating layer 150 and connected to an upper connection terminal 154 through the upper interconnection 158.

A bottom surface 30B of the TSV structure 30 may be covered with a conductive layer 172. A connection terminal 174 may be connected to the TSV structure 30 through the conductive layer 172.

In some embodiments, the upper connection terminal 154 may be omitted from the IC device 200 according to some embodiments of the present inventive concept. The IC device 200 illustrated in FIG. 5 may include the interlayer insulating layer 14B having the second sidewall SW22 including the first surface portion S1 having a corrugated portion as illustrated in FIG. 2, instead of the interlayer insulating layer 134.

The IC device 200 illustrated in FIG. 5 may include the substrate 12 having the first sidewall SW31 including the third surface portion S3 having the non-flat portion as illustrated in FIG. 3A, or the substrate 12 having the protrusion 41P as illustrated in FIG. 3B, instead of the substrate 120 illustrated in FIG. 5.

Figure 6A:
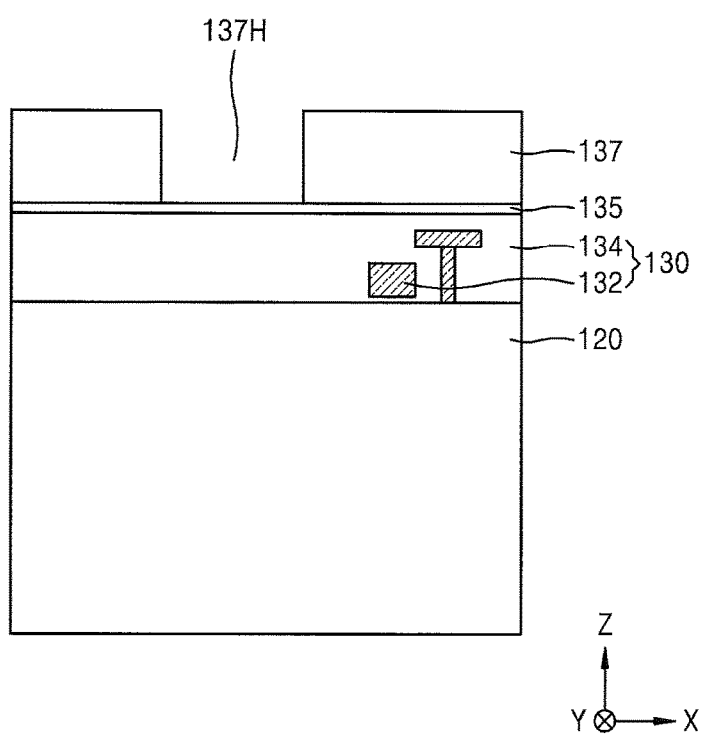
FIGS. 6A to 6O are cross-sections illustrating processing steps in the fabrication of IC devices according to some embodiments of the present inventive concept.

Methods of manufacturing IC devices according to some embodiments of the present inventive concept will be discussed. FIGS. 6A to 6O are cross-sections illustrating processing steps in the fabrication of the IC device 100 illustrated in FIG. 4 according to some embodiments will be discussed. In FIGS. 6A to 6O, the same reference numerals are used to denote the same elements as in FIGS. 1A to 4 and, thus, detailed descriptions thereof are omitted in the interest of brevity.

Referring to FIG. 6A, an FEOL structure 130 may be formed on a substrate 120, a first polishing stop layer 135 may be formed on the FEOL structure 130, and a mask pattern 137 may be formed on the first polishing stop layer 135. A hole 137H may be formed in the mask pattern 137 to expose a portion of a top surface of the first polishing stop layer 135.

In some embodiments, the first polishing stop layer 135 may include a silicon nitride layer or a silicon oxynitride layer. The first polishing stop layer 135 may be formed to a thickness of about 200 Å to about 1000 Å. The first polishing stop layer 135 may be formed by using a CVD process. The mask pattern 137 may include, for example, a photoresist layer.

Figure 6B:
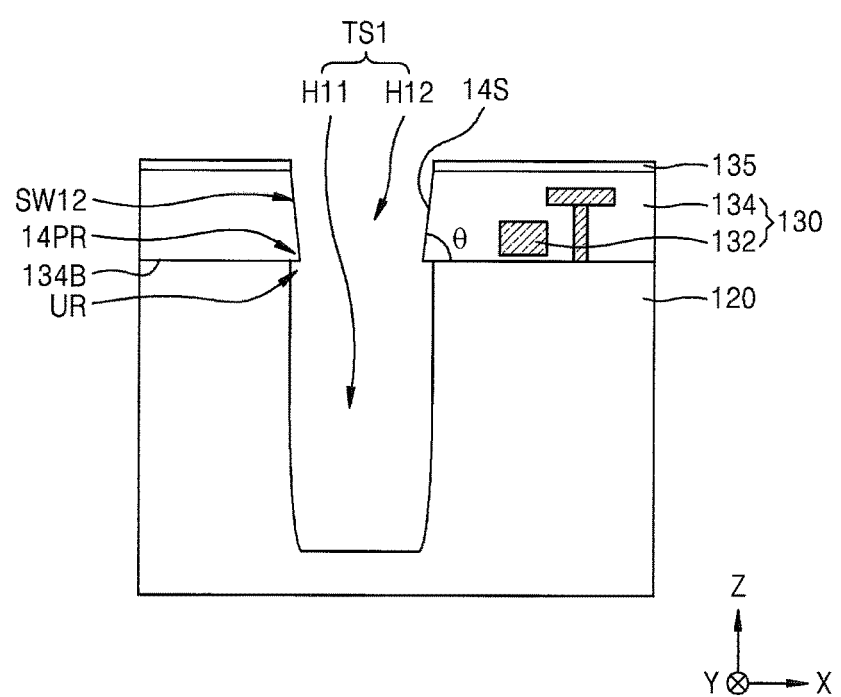

Referring to FIG. 6B, the first polishing stop layer 135 and the interlayer insulating layer 134 may be etched by using the mask pattern 137 (refer to FIG. 6A) as an etch mask, and the substrate 120 may be then etched to form a TSV space TS1. The TSV space TS1 may include a first hole H11 and a second hole H12. The first hole H11 may be formed to a predetermined depth in the substrate 120. The second hole H12 may penetrate the interlayer insulating layer 134 and communicate with the first hole H11.

After the TSV space TS1 is formed, a second sidewall SW12 and a protrusion 13PR may be formed in the interlayer insulating layer 134. The second sidewall SW12 may define the second hole H12 and have an inclined sidewall portion 14S. The protrusion 13PR may protrude toward the inside of the TSV space TS1. An undercut region UR may be formed in the TSV space TS1 under the protrusion 14PR of the interlayer insulating layer 134.

In the protrusion 14PR of the interlayer insulating layer 134, an angle θ formed between a bottom surface 134B of the interlayer insulating layer 134 with the inclined sidewall portion 14S may be selected in the range of about 75° to about 85°.

The TSV space TS1 may be formed by using an anisotropic etching process. In some embodiments, the TSV space TS1 may be formed to a width of about 10 μm or less in the substrate 120. In some embodiments, the TSV space TS1 may be formed to a depth of about 50 μm to about 100 μm from the top surface of the interlayer insulating layer 134. However, the TSV space TS1 is not limited to the above-described width and depth and may have various dimensions as needed. The substrate 120 may be exposed by the first hole H11 of the TSV space TS1, and the inclined sidewall portion 14S of the interlayer insulating layer 134 may be exposed by the second hole H12 of the TSV space TS1.

In some embodiments, after the TSV space TS1 is formed, as illustrated in FIG. 6B, to obtain the interlayer insulating layer 134 having the inclined sidewall portion 14S and the protrusion 14PR and the substrate 120 having the undercut region UR, etching conditions of the interlayer insulating layer 134 and the substrate 120, for example, a combination of etching gases, gas flow rates, and an etch rate, may be controlled during a process of etching the interlayer insulating layer 134 and the substrate 120. In some embodiments, when the second hole H12 is formed by etching the interlayer insulating layer 134, a CFx-based gas, for example, $C_4F_8$, and an additive gas, for example, Ar, $N_2$, $O_2$, or $H_2$, may be used as etching gases. In these embodiments, an inclined angel of the inclined sidewall portion 14S of the interlayer insulating layer 134 may be controlled by adjusting contents of $O_2$ gas and/or $H_2$ gas. During the etching of the interlayer insulating layer 134, as the contents of $O_2$ and/or $H_2$ gases increase, an angle θ formed between the bottom surface 134B of the interlayer insulating layer 134 and the inclined sidewall portion 14S may increase. In contrast, as the contents of $O_2$ and/or $H_2$ gases decrease, the angle θ formed between the bottom surface 134B of the interlayer insulating layer 134 and the inclined sidewall portion 14S may decrease. The contents of $O_2$ and/or $H_2$ gases in an etching gas used for etching the interlayer insulating layer 134 may be optimized such that the angle θ ranges from about 75° to about 85°. In some embodiments, when the first hole H11 is formed by etching the substrate 120, an ICP DRIE process may be performed by using $SF_6$ or $O_2$ plasma. In these embodiments, the undercut region UR may be formed in a portion adjacent to a top surface of the substrate 120 by adjusting the amount of $O_2$ plasma. For example, during the etching of the substrate 120, a lateral etched amount of the substrate may be increased near the top surface of the substrate 120 by increasing a flow rate of $O_2$ plasma more than when the undercut region UR is not formed. However, according some embodiments of the present inventive concept, methods of forming the undercut region UR are not limited to the above-described example, and the undercut region UR may be formed by controlling various process conditions without departing from the scope of the present inventive concept.

For example, after the TSV space TS1 is formed, when the angle θ formed between the bottom surface 134B of the interlayer insulating layer 134 and the inclined sidewall portion 14S is less than about 75°, an etch rate of the interlayer insulating layer 134 may be excessively low and adversely affect throughput. Furthermore, a critical dimension (CD) of an end portion of the second hole H12 at the side of the substrate 120 may be undesirably greatly different from a CD of an end portion of an entrance of the second hole H12 so that a space occupied by the TSV space TS1 may be unnecessarily large. Furthermore, when the angle θ formed between the bottom surface 134B of the interlayer insulating layer 134 and the inclined sidewall portion 14S exceeds about 85°, after the TSV structure 30 is formed in the TSV space TS1 in a subsequent process, stress caused by the TSV structure 30 may be released in a vertical direction. As a result, the likelihood of delamination defects may increase in the TSV structure 30 and the vicinity thereof.

In general, when a process of forming a TSV structure according to a via middle scheme is used, the TSV structure may be formed before a metal interconnection layer required for an IC device is formed. Thus, after the metal interconnection layer is formed, delamination defects may be likely to occur between a conductive plug and a conductive barrier layer of the TSV structure. However, in a method of manufacturing an IC device according to some embodiments, the formation of the TSV space TS1 may include forming the second hole H12 such that the angle θ formed between the bottom surface 134B of the interlayer insulating layer 134 and the inclined sidewall portion 14S ranges from about 75° to about 85°. The range of the angle θ may be an optimum condition for inhibiting delamination defects between the conductive plug and the conductive barrier layer of the TSV structure. As a result, the likelihood of damaging or degrading the TSV structure 30 and elements located around the TSV structure 30 due to process atmospheres during the manufacture of the IC device may be reduced or, possibly prevented.

In some embodiments, instead of a sectional profile of the first hole H11 illustrated in FIG. 6B, a surface portion having a non-flat portion may be formed on a sidewall of the substrate 120 exposed by the first hole H1, similar to the third surface portion S3 exposed by the first through hole H31 in the substrate 12 of the IC device 10C illustrated in FIG. 3A. In these embodiments, a bosch process discussed above with respect to FIG. 3A may be employed to etch the substrate 120 and form the first hole H11.

In some embodiments, the TSV space TS1 may be formed by using a laser drilling technique. In some embodiments, the interlayer insulating layer 134 may include a multilayered structure in which a plurality of insulating layers, for example, insulating layers 14B1, 14B2, 14B3, 14B4, and 14B5 illustrated in FIG. 2, are stacked. In these embodiments, after the second hole H12 is formed by etching the interlayer insulating layer 134, the inclined sidewall portion 14S of the interlayer insulating layer 134 exposed by the second hole H12 may have a corrugated shape similar to that of the first surface portion S1 illustrated in FIG. 2.

After the TSV space TS1 is formed, the mask pattern 137 (refer to FIG. 6A) may be removed to expose a top surface of the first polishing stop layer 135.

Figure 6C:
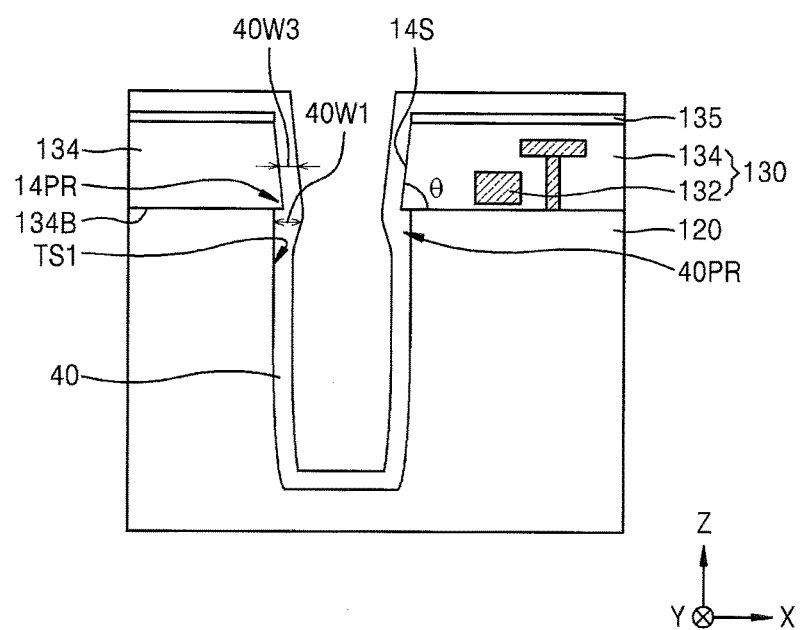

Referring to FIG. 6C, a via insulating layer 40 may cover an inner sidewall and a bottom surface of the TSV space TS1.

The via insulating layer 40 may cover a surface of the substrate 120, a surface of the interlayer insulating layer 134, and a surface of the first polishing stop layer 135, which are exposed in the TSV space TS1.

The via insulating layer 40 may be formed under the protrusion 14PR to fill the undercut region UR (refer to FIG. 6B). Thus, a width 40W1 of the protrusion region 40PR of the via insulating layer 40 in a horizontal direction (X direction) may be greater than a width 40W3 of a portion of the via insulating layer 40, which covers the inclined sidewall portion 14S of the interlayer insulating layer 134, in the horizontal direction (X direction).

Figure 6D:
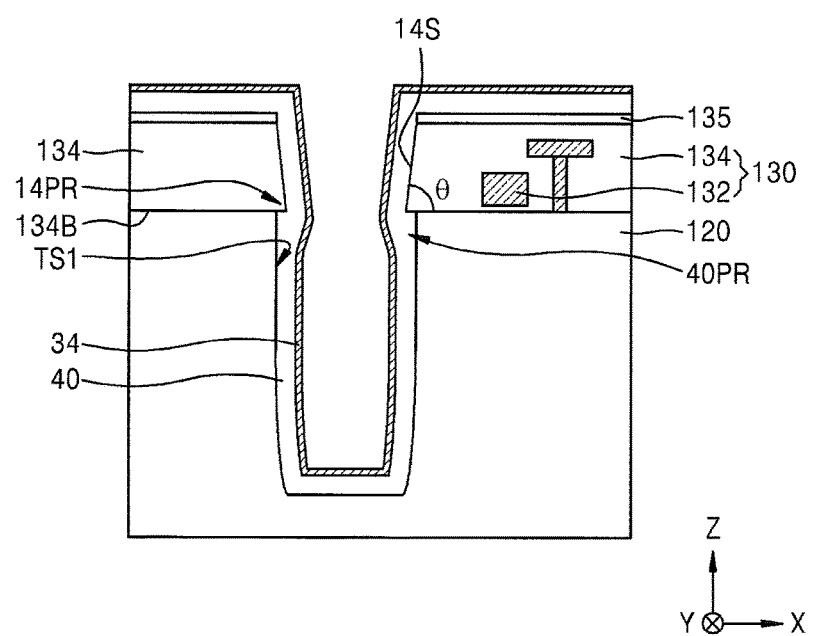

Referring to FIG. 6D, a conductive barrier layer 34 may be formed inside and outside the TSV space TS1 on the via insulating layer 40. The conductive barrier layer 34 may be formed by using, for example, a PVD process or a CVD process.

In some embodiments, the conductive barrier layer 34 may be a single layer including one kind of material or a multilayered structure including at least two materials. In some embodiments, the conductive barrier layer 34 may include at least one material selected from the group consisting of tungsten (W), tungsten nitride (WN), tungsten carbide (WC), titanium (Ti), titanium nitride (TiN), tantalum (Ta), tantalum nitride (TaN), ruthenium (Ru), cobalt (Co), manganese (Mn), tungsten nitride (WN), nickel (Ni), or nickel boron (NiB). For example, the conductive barrier layer 34 may have a stack structure of a TaN layer having a thickness of about 50 Å to about 20 Å and a Ta layer having a thickness of about 1000 Å to about 3000 Å.

Figure 6E:
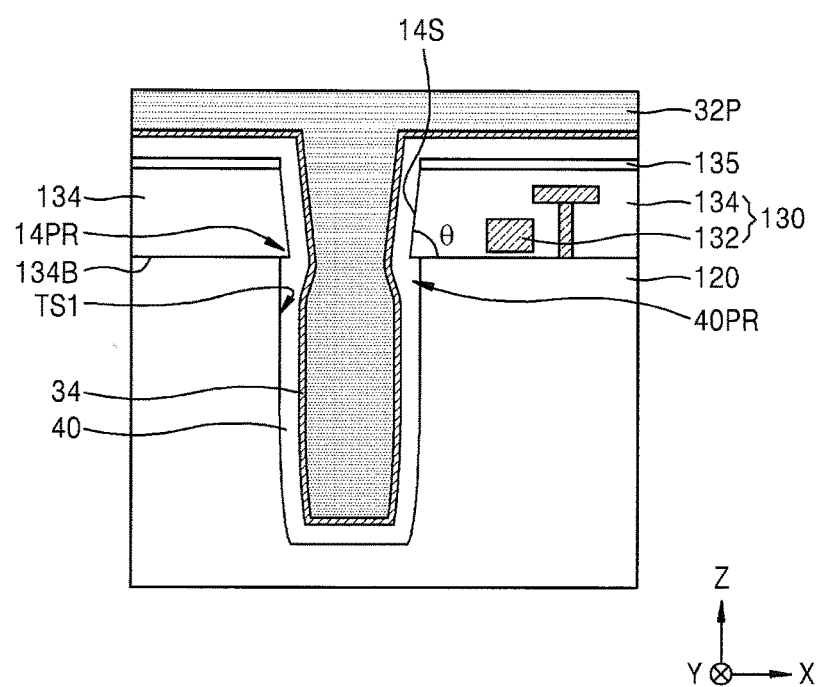

Referring to FIG. 6E, a metal layer 32P may be formed on the conductive barrier layer 34 to fill the remaining space of the TSV space TS1.

After the conductive barrier layer 34 is formed as discussed above with respect to FIG. 6D, the formation of the metal layer 32P may be performed while maintaining a vacuum atmosphere that is used during the formation of the conductive barrier layer 34. However, a pressure for forming the metal layer 32P may be different from a pressure for forming the conductive barrier layer 34.

The metal layer 32P may cover the conductive barrier layer 34 inside and outside the TSV space TS1.

In some embodiments, the metal layer 32P may be formed by using an electroplating process. In particular, a metal seed layer (not shown) may be formed on a surface of the conductive barrier layer 34. Thereafter, a metal layer may be grown from the metal seed layer by using an electroplating process so that a metal layer 32P may be formed on the conductive barrier layer 34 to fill the TSV space TS1. The metal seed layer may include Cu, a Cu alloy, Co, Ni, Ru, Co/Cu, or Ru/Cu. The metal seed layer may be formed by using a PVD process. The metal layer 32P may include Cu or W serving as a main material. In some embodiments, the metal layer 32P may include Cu, CuSn, CuMg, CuNi, CuZn, CuPd, CuAu, CuW, W, or a W alloy, but it will be understood that embodiments of the inventive concept are not limited thereto. The electroplating process may be performed at a temperature of from about 10° C. to about 65° C. For example, the electroplating process may be performed at room temperature. After the metal layer 32P is formed, the resultant structure including the metal layer 32P may be annealed at a temperature of from about 150° C. to about 450° C. as needed.

Figure 6F:
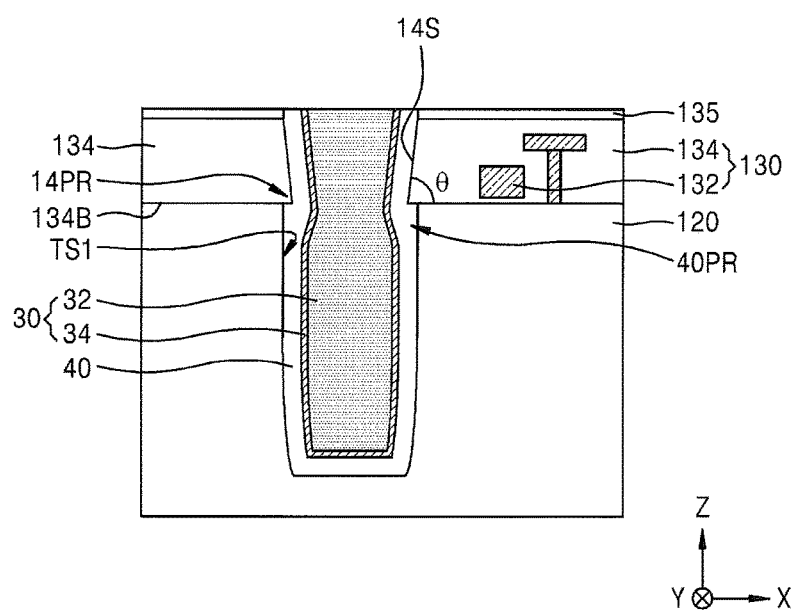

Referring to FIG. 6F, the resultant structure including the metal layer 32P as illustrated in FIG. 6E may be polished by a chemical mechanical polishing (CMP) process using the first polishing stop layer 135 as a stopper to expose the first polishing stop layer 135.

As a result, portions of the via insulating layer 40, the conductive barrier layer 34, and the metal layer 32P, which are located outside the TSV space TS1, may be removed, and a conductive plug 32, which is a portion of the metal layer 32P, may remain on the conductive barrier layer 34 in the TSV space TS1.

Figure 6G:
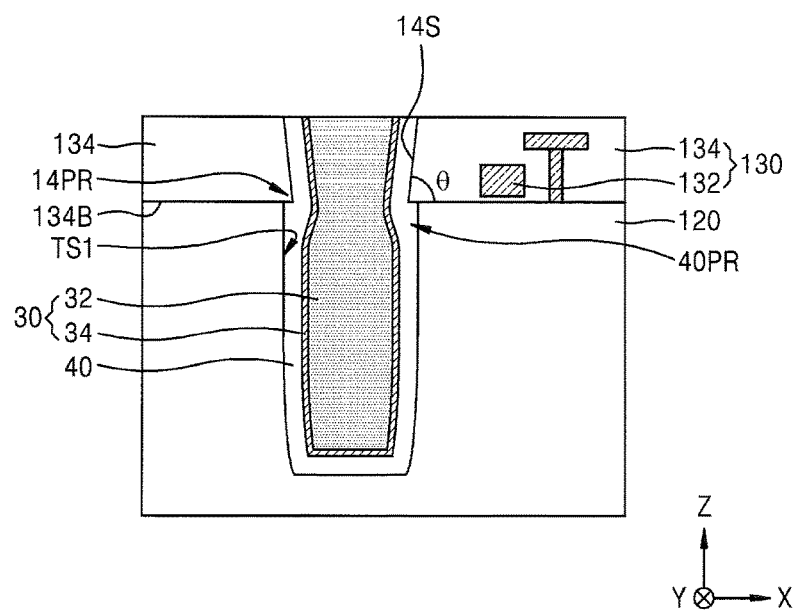

Referring to FIG. 6G, the resultant structure including the conductive plug 32 formed in the TSV space TS1 may be thermally treated. As a result, metal particles included in the conductive plug 32 may grow so that roughness of an exposed surface of the conductive plug 32 may be degraded.

Portions of the metal particles grown due to the thermal treatment, which protrude out of the TSV space TS1, may be removed by using a CMP process. In these embodiments, the first polishing stop layer 135 (refer to FIG. 6F) may also be removed so that a top surface of the interlayer insulating layer 134 of the FEOL structure 130 may be exposed. In some embodiments, the thermal treatment may be performed at a temperature of about 400° C. to about 500° C.

The TSV structure 30 including the conductive plug 32 and the conductive barrier layer 34 surrounding the conductive plug 32 may be left in the TSV space TS1.

Figure 6H:
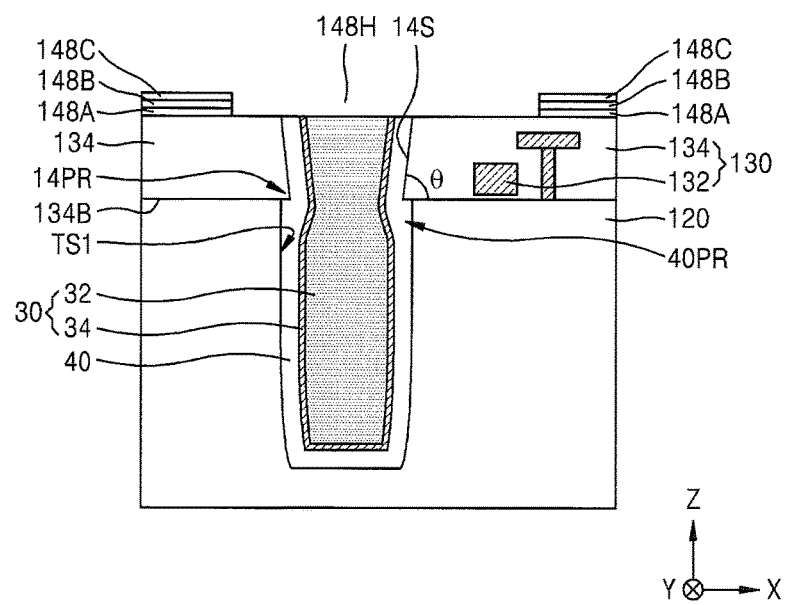

Referring to FIG. 6H, after the resultant structure including the TSV structure 30 illustrated in FIG. 6G is cleaned, a second polishing stop layer 148A, an insulating layer 148B, and a third polishing stop layer 148C may be sequentially formed on the interlayer insulating layer 134 and patterned, thereby forming a metal interconnection hole 148H that exposes a top surface of the TSV structure 30 and the vicinity thereof at an entrance of the TSV space TS1.

The second polishing stop layer 148A may be used as an etch stopper during the formation of the metal interconnection hole 148H.

Portions of the TSV structure 30, the via insulating layer 40, and the interlayer insulating layer 134 may be exposed by the metal interconnection hole 148H. In some embodiments, the metal interconnection hole 148H may be formed to expose only the top surface of the TSV structure 30.

In some embodiments, the insulating layer 148B may include tetra-ethyl-ortho-silicate (TEOS). Each of the second polishing stop layer 148A and the third polishing stop layer 148C may include a silicon nitride layer or a silicon oxynitride layer. A thickness of each of the second polishing stop layer 148A, the insulating layer 148B, and the third polishing stop layer 148C may be arbitrarily determined as needed.

Figure 6I:
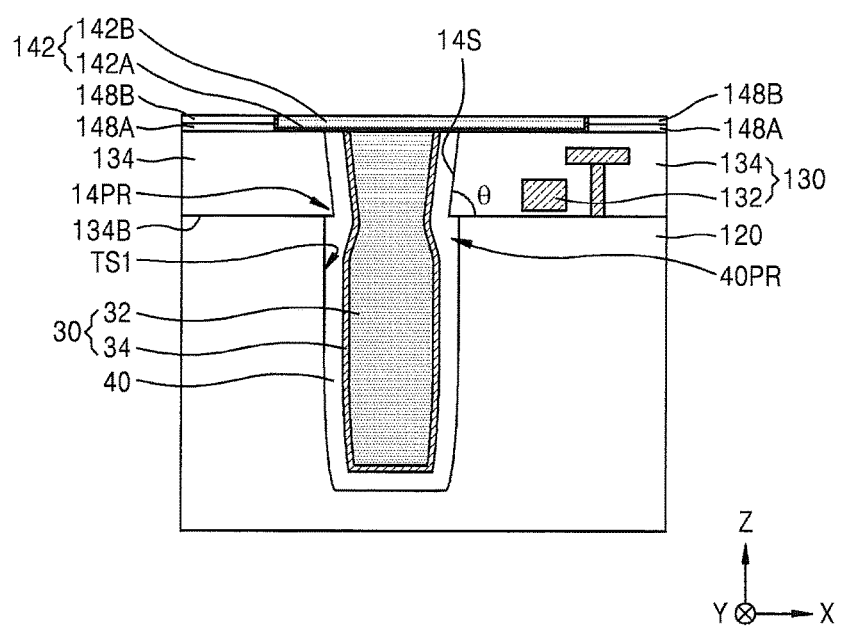

Referring to FIG. 6I, a metal interconnection layer 142 may be formed in the metal interconnection hole 148H. The metal interconnection layer 142 may have a structure including an interconnection barrier layer 142A and an interconnection metal layer 142B that are stacked sequentially.

In some embodiments, the formation of the metal interconnection layer 142 may include sequentially forming a first layer for forming an interconnection barrier layer 142A and a second layer for forming an interconnection metal layer 142B in the metal interconnection hole 148H and the third polishing stop layer 148C (refer to FIG. 6H) and polishing the resultant structure including the first layer and the second layer by a CMP process using the third polishing stop layer 148C as a stopper. During the CMP process, a top surface of the insulating layer 148B may be exposed by removing the third polishing stop layer 148C. As a result, a metal interconnection layer 142 including the interconnection barrier layer 142A and the interconnection metal layer 142B may be left in the metal interconnection hole 148H (refer to FIG. 6H).

In some embodiments, the interconnection barrier layer 142A may include at least one material selected from the group consisting of Ti, TiN, Ta, or TaN. In some embodiments, the interconnection barrier layer 142A may be formed by using a PVD process. The interconnection barrier layer 142A may be formed to a thickness of about 1000 Å to about 1500 Å.

In some embodiments, the interconnection metal layer 142B may include copper (Cu). The formation of the interconnection metal layer 142B may include forming a copper seed layer on the surface of the interconnection barrier layer 142A, growing a copper layer from the copper seed layer by using an electroplating process, and annealing the resultant structure including the copper layer.

Figure 6J:
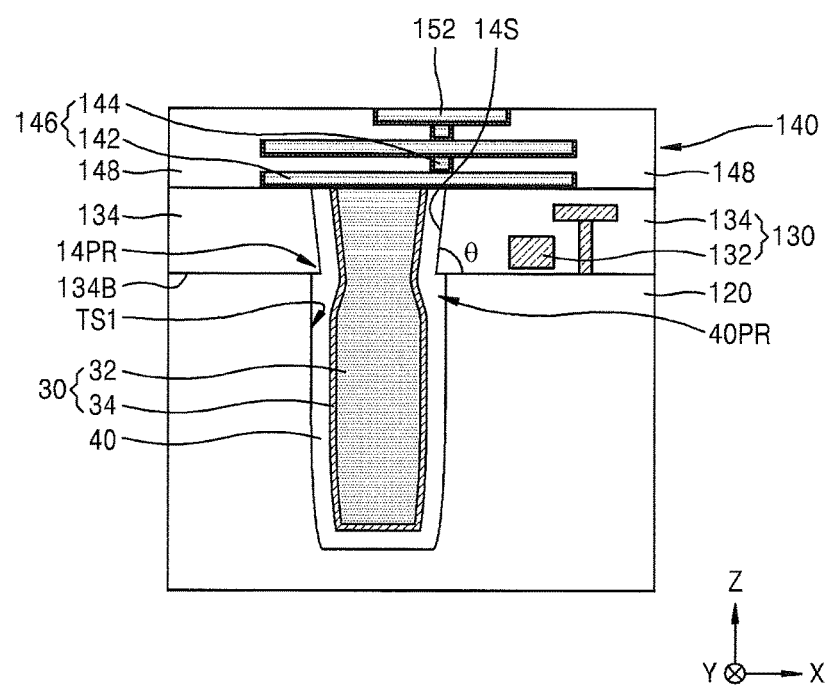

Referring to FIG. 6J, a process similar to the process of forming the metal interconnection layer 142 discussed above with respect to FIGS. 6H and 6I may be performed so that a contact plug 144 having the same stack structure as the metal interconnection layer 142 may be formed on the metal interconnection layer 142. Thereafter, the process of forming the metal interconnection layer 142 discussed above with respect to FIGS. 6H and 6I and the process of forming the contact plug 144 may be alternately performed plural times.

Thus, a multilayered interconnection structure 146 in which a plurality of metal interconnection layers 142 and a plurality of contact plugs 144 are alternately connected to one another, and a bonding pad 152 connected to the multilayered interconnection structure 146 may be formed.

Although multilayered interconnection structure 146 includes two metal interconnection layers 142 and two contact plugs 144, embodiments of the present inventive concept are not limited thereto. Furthermore, the multilayered interconnection structure 146 illustrated in FIG. 6J is only an example of a structure in which the metal interconnection layers 142 are connected to the contact plugs 144, and the inventive concept is not limited to the structure illustrated in FIG. 6J.

In some embodiments, each of the plurality of metal interconnection layers 142 and the plurality of contact plugs 144 may include at least one metal selected from the group consisting of tungsten (W), aluminum (Al), or copper (Cu). In some embodiments, the plurality of metal interconnection layers 142 and the plurality of contact plugs 144 may include the same material. In some embodiments, at least some of the plurality of metal interconnection layers 142 and the plurality of contact plugs 144 may include different materials.

In some embodiments, when the multilayered interconnection structure 146 is formed, other multilayered interconnection structures (not shown) including metal interconnection layers and contact plugs may be formed on other regions of the substrate 120 at the same time as at least some selected from the plurality of metal interconnection layers 142 and the plurality of contact plugs 144. As a result, a BEOL structure 140 including a metal interlayer insulating layer 140 and a plurality of multilayered interconnection structures may be formed on the FEOL structure 130. The metal interlayer insulating layer 148 may include a plurality of second polishing stop layers 148A and a plurality of insulating layers 148B (refer to FIG. 6J). The plurality of multilayered interconnection structures may include portions insulated by the metal interlayer insulating layer 148. The BEOL structure 140 may include a plurality of multilayered interconnection structures configured to connect individual devices included in the FEOL structures 130 with other interconnections formed on the substrate 120. In some embodiments, the BEOL structure 140 may further include a seal ring configured to protect the interconnection structures and other structures located thereunder from external shock or moisture.

Figure 6K:
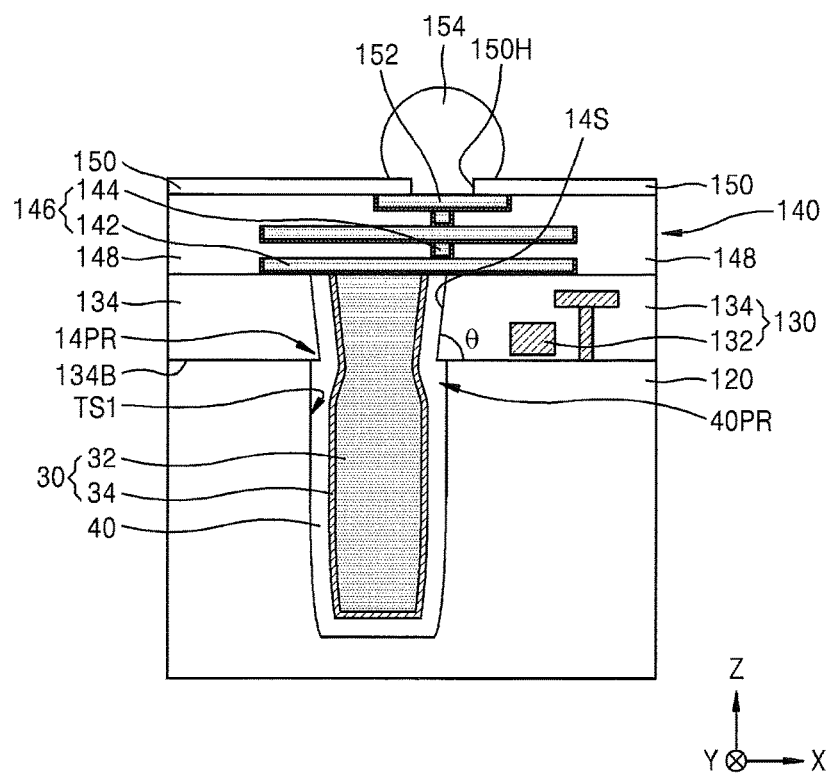
Figure 6L:
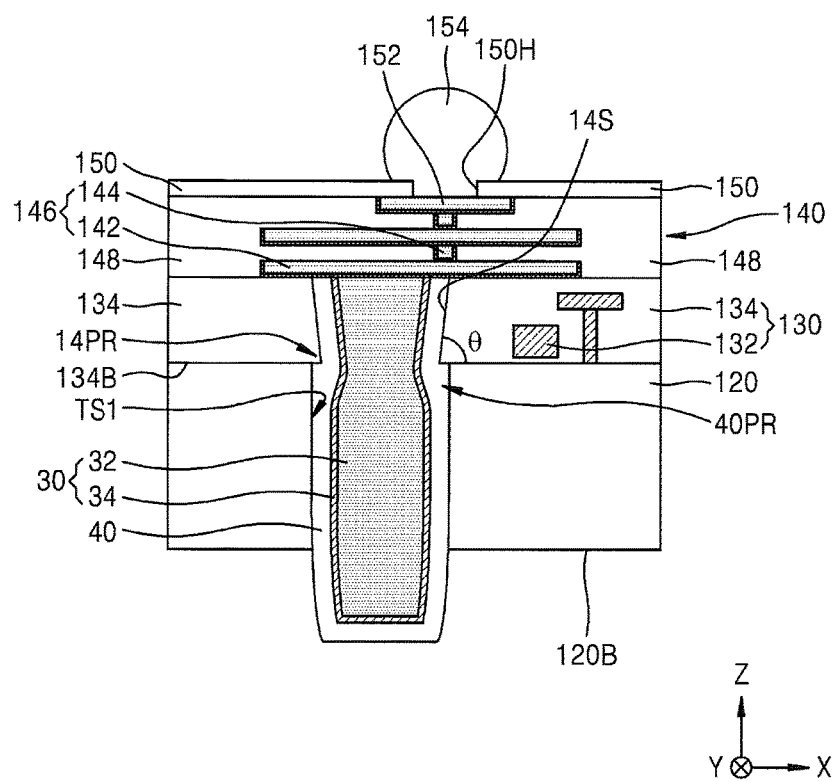

Referring to FIG. 6K, after an upper insulating layer 150 including a hole 150H exposing the bonding pad 152 is formed on the BEOL structure 140, an upper connection terminal 154, which is connected to the bonding pad 152 through the hole 150H, may be formed on the upper insulating layer 150.

In some embodiments, the upper insulating layer 150 may include one of a silicon oxide layer, a silicon nitride layer, a polymer, and a combination thereof.

Referring to FIG. 6I, a bottom surface of the substrate 120 may be partially removed so that the TSV structure 30 surrounded with the via insulating layer 40 may protrude from the bottom surface 120B of the substrate 120.

Figure 6M:
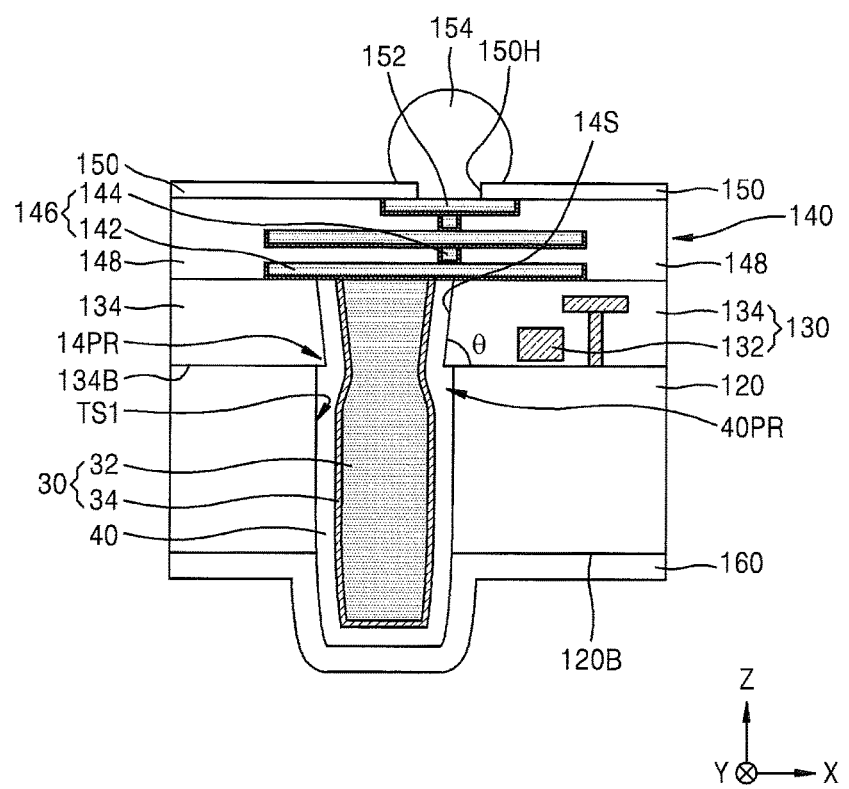

Referring to FIG. 6M, a lower insulating layer 160 may cover the bottom surface 120B of the substrate 120. The lower insulating layer 160 may cover the via insulating layer 40 that protrudes from the bottom surface 120B of the substrate 120. In some embodiments, the lower insulating layer 160 may be formed by using a CVD process. In some embodiments, the lower insulating layer 160 may include one of a silicon oxide layer, a silicon nitride layer, and a polymer.

Figure 6N:
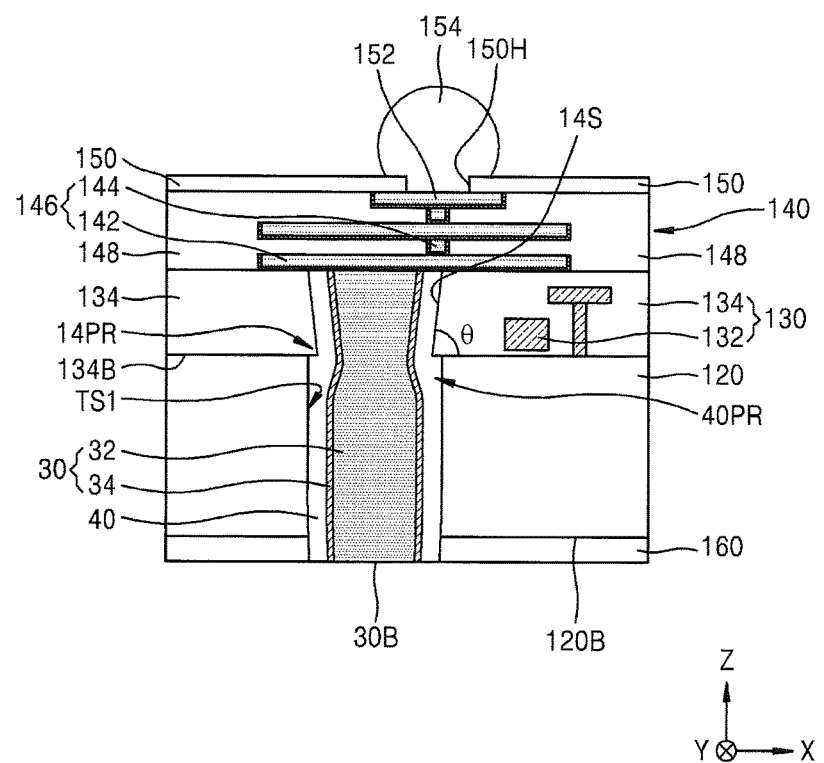
Figure 60:
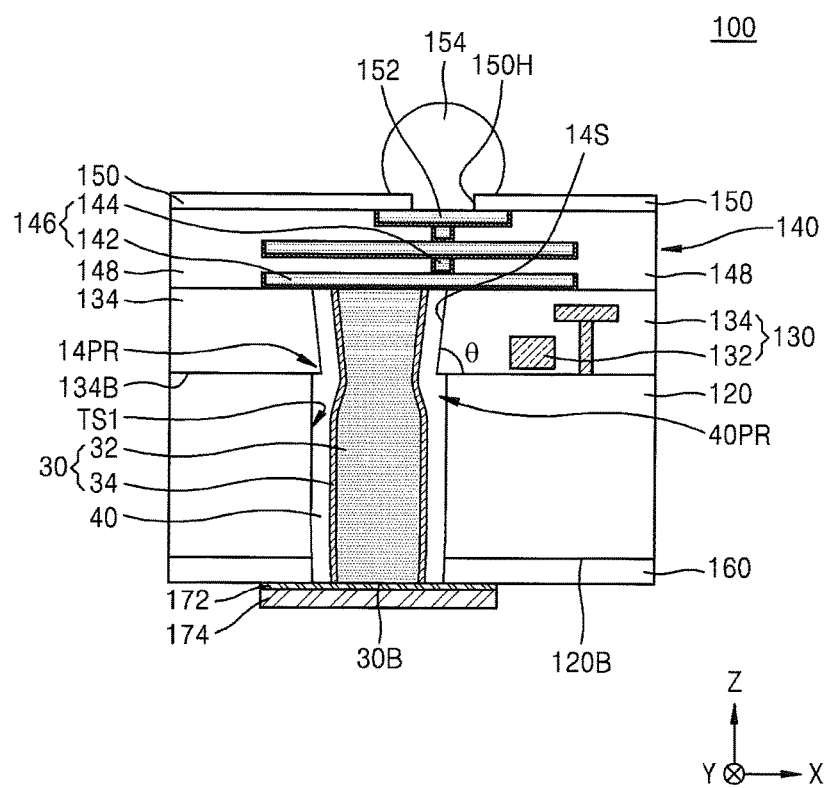

Referring to FIG. 6N, a polishing process may be performed on an exposed surface of the lower insulating layer 160 until a planarized surface is obtained at a side of the bottom surface 120B of the substrate 120. Thus, a bottom surface 30B of the TSV structure 30 may be exposed at the side of the bottom surface 120B of the substrate 120.

Referring to FIG. 6O, a conductive layer 172 and a connection terminal 174 may be formed on the bottom surface 120B of the substrate 120 and connected to the TSV structure 30. The conductive layer 172 may include a under bump metallization (UBM) layer and include layers having various compositions according to constituent elements of the connection terminal 174. In some embodiments, the conductive layer 172 may include titanium (Ti), copper (Cu), nickel (Ni), gold (Au), nickel vanadium (NiV), nickel phosphide (NiP), titanium nickel (TiNi), titanium tungsten (TiW), tantalum nitride (TaN), aluminum (Al), palladium (Pd), chromium copper (CrCu), or a combination thereof. For example, the conductive layer 172 may have a Cr/Cu/Au stack structure, a Cr/CrCu/Cu stack structure, a TiWCu compound, a TiWCu/Cu stack structure, a Ni/Cu stack structure, a NiV/Cu stack structure, a Ti/Ni stack structure, a Ti/NiP stack structure, a TiWNiV compound, an Al/Ni/Au stack structure, an Al/NiP/Au stack structure, a stack structure of a Ti/TiNi/CuNi compound, a Ti/Ni/Pd stack structure, a Ni/Pd/Au stack structure, or a NiP/Pd/Au stack structure.

The connection terminal 174 may include a conductive pad, a solder ball, a solder bump, or a redistribution conductive layer. The connection terminal 174 may be connected to the bottom surface 30B of the TSV structure 30 through the conductive layer 172. The connection terminal 174 may include Ni, Cu, Al, or a combination thereof, however, it will be understood that embodiments of the present inventive concept are not limited thereto.

A method of manufacturing the IC device 100 illustrated in FIG. 4, according to some embodiments, has been discussed above with respect to FIGS. 6A to 6O, however, it will be understood that the inventive concept is not limited thereto. It will be understood that the IC devices 10A, 10B, 10C, 10D, 10E, and 200 illustrated in FIGS. 1A to 3C and 5 or various IC devices having similar structures thereto may be manufactured by variously changing and modifying the method discussed above with respect to FIGS. 6A to 6O within the scope of the inventive concept.

Figure 7:
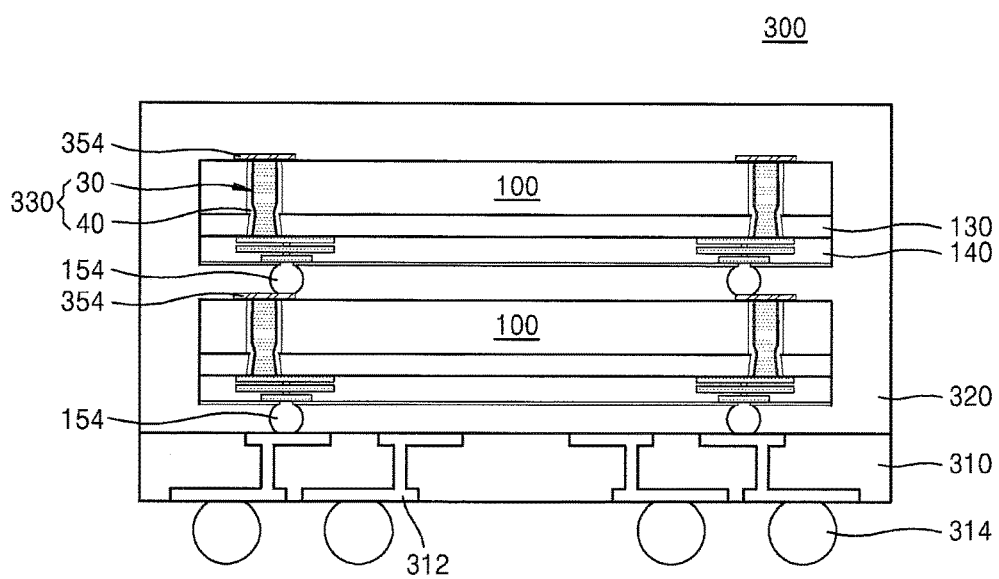
FIG. 7 is a schematic cross-section of a semiconductor package according to some embodiments of the present inventive concept.

FIG. 7 is a schematic cross-section of a semiconductor package 300 according to some embodiments. In FIG. 7, the same reference numerals are used to denote the same elements as in FIGS. 1A to 5, and therefore, detailed descriptions thereof are omitted in the interest of brevity.

Referring to FIG. 7, the semiconductor package 300 may include a package substrate 310 and at least one IC device 100 mounted on the package substrate 310.

In some embodiments, the package substrate 310 may be a PCB in which an interconnection structure 312 is formed.

FIG. 7 illustrates the semiconductor package 300 in which two IC devices 100 are mounted, but the inventive concept is not limited thereto, and various numbers of IC devices 100 may be mounted on the package substrate 310 in a vertical direction or a horizontal direction. In FIG. 7, some elements of the IC device 100 illustrated in FIG. 4 are omitted or simplified for brevity. In the IC device 100, the TSV structure 30 and the via insulating layer 40 surrounding the TSV structure 30 may constitute a TSV unit 330.

A plurality of connection terminals 314 may be formed on the package substrate 310 and connected to the interconnection structure 312 included in the package substrate 310 to enable electrical connection with the outside. In some embodiments, the plurality of connection terminals 314 may include solder balls, however, it will be understood that the inventive concept is not limited thereto.

Electrical connection of the package substrate 310 with the IC device 100 or electrical connection of two adjacent IC devices 100 may be enabled by the TSV structure 30, an upper connection terminal 154, and a connection terminal 354 formed in the IC device 100.

As illustrated in FIG. 7, in the semiconductor package 300, two IC devices 100 may be vertically mounted on the package substrate 310 and electrically connected to each other. The semiconductor package 300 may include a molding layer 320 configured to mold at least one IC device 100. In some embodiments, the molding layer 320 may include a polymer. For example, the molding layer 320 may include an epoxy molding compound (EMC).

Figure 8:
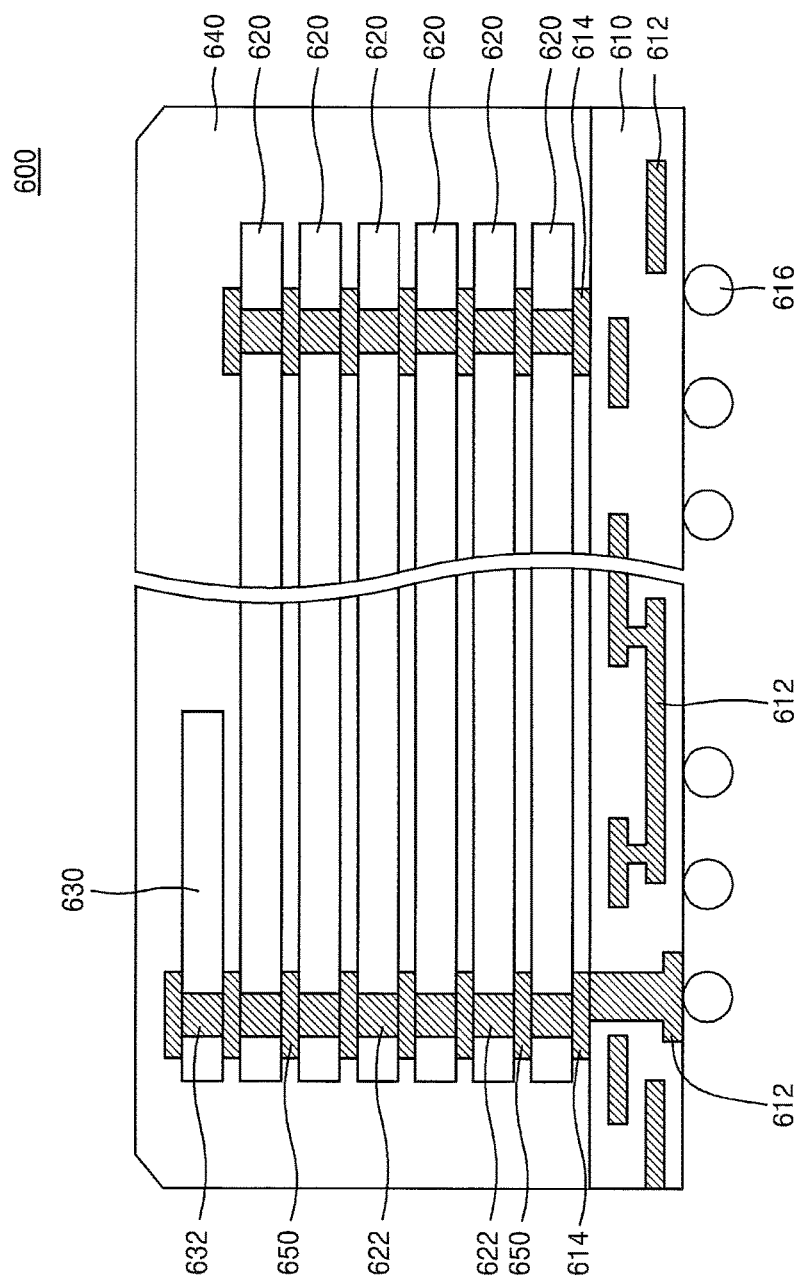
FIG. 8 is a cross-section of main elements of a semiconductor package according to some embodiments of the present inventive concept.

FIG. 8 is a cross-section of main elements of a semiconductor package 600 according to some embodiments. As illustrated in FIG. 8, the semiconductor package 600 may include a plurality of semiconductor chips 620 sequentially stacked on a package substrate 610. A control chip 630 may be located on and connected to the plurality of semiconductor chips 620. The stack structure of the plurality of semiconductor chips 620 and the control chip 630 may be encapsulated by using an encapsulant 640 (for example, a thermosetting resin) on the package substrate 610. FIG. 8 illustrates a structure including six semiconductor chips 620 stacked vertically, but the number and stacked direction of the semiconductor chips 620 are not limited thereto. The number of the semiconductor chips 620 may be determined as smaller or larger than 6 as needed. The plurality of semiconductor chips 620 may be arranged on the package substrate 610 in a horizontal direction or form a connection structure by combining the arrangement of some semiconductor chips 620 in the vertical direction or the arrangement of other semiconductor chips 620 in the horizontal direction. In some embodiments, the control chip 630 may be omitted.

The package substrate 610 may include a flexible printed circuit board (flexible PCB), a rigid PCB, or a combination thereof. The package substrate 610 may include a substrate internal interconnection 612 and a connection terminal 614. The connection terminal 614 may be formed on one surface of the package substrate 610. A solder ball 616 may be formed on the other surface of the package substrate 610. The connection terminal 614 may be electrically connected to the solder ball 616 via the substrate internal interconnection 612. In some embodiments, the solder ball 616 may be replaced by a conductive bump or a lead grid array (LGA).

The semiconductor package 600 may include TSV units 622 and 632. The TSV units 622 and 632 may be electrically connected to the connection terminal 614 of the package substrate 610 by a connection member 650 (e.g., a bump). In some embodiments, the TSV unit 632 may be omitted from the control chip 630.

At least one of the plurality of semiconductor chips 620 and the control chip 630 may include at least one of the IC devices 10A, 10B, 10C, 10D, 10E, 100, and 200 discussed above with respect to FIGS. 1A to 5. Furthermore, the TSV units 622 and 632 may include the TSV structure 30 and the via insulating layer 40, which are discussed above with respect to FIGS. 1A to 5, Furthermore, at least one of the plurality of semiconductor chips 620 and the control chip 630 may include the substrate 12 or 120 and the interlayer insulating layer 14 or 134 having characteristic structures, which are discussed above with respect to FIGS. 1A to 5.

Each of the plurality of semiconductor chips 620 may include system LSI, flash memory, DRAM, SRAM, EEPROM, PRAM, MRAM, or RRAM. The control chip 630 may include logic circuits, such as serializer/deserializer (SER/DES) circuits.

Figure 9:
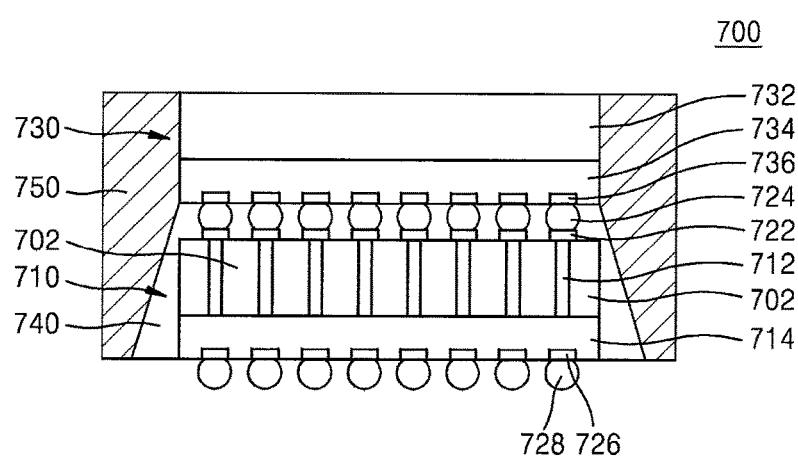
FIG. 9 is a cross-section of a semiconductor package according to some embodiments of the present inventive concept.

Referring now to FIG. 9, a cross-section of a semiconductor package 700 according to some embodiments of the present inventive concept will be discussed. As illustrated in FIG. 9, the semiconductor package 700 may include a first chip 710, a second chip 730, an underfill 740, and an encapsulant 750.

The first chip 710 may have a characteristic structure of at least one of the IC devices 10A, 10B, 10C, 10D, 10E, 100, and 200 discussed above with respect to FIGS. 1A to 5. The first chip 710 may include a plurality of TSV units 712 penetrating a semiconductor structure 702. Each of the plurality of TSV units 712 may include a TSV structure 30 and a via insulating layer 40, which are discussed above with respect to FIGS. 1A to 5. Furthermore, the first chip 710 may include the substrate 12 or 120 and the interlayer insulating layer 14 or 134 having characteristic structures, which are discussed above with respect to FIGS. 1A to 5. The semiconductor structure 702 may include at least one of the structures illustrated in FIGS. 1A to 3C.

In some embodiments, the first chip 710 may have the same structure as the IC device 100 illustrated in FIG. 4, and a device layer 714 of the first chip 710 may correspond to the BEOL structure 140 illustrated in FIG. 4. In some embodiments, the first chip 710 may have the same structure as the IC device 200 illustrated in FIG. 5, and the device layer 714 may be omitted.

An upper pad 722 and a connection terminal 724 may be located at one side of the first chip 710 and connected to one end of each of the plurality of TSV units 712. Furthermore, an electrode pad 726 and a connection terminal 728 may be connected to the other end of the first chip 710. The connection terminals 724 and 728 may include solder balls or bumps.

The second chip 730 may include a substrate 732 and an interconnection structure 734 formed on the substrate 732. An IC layer may be further formed on the substrate 732. The second chip 730 may not include a TSV structure. An electrode pad 736 may be connected to the interconnection structure 734. The interconnection structure 734 may be connected to the TSV unit 712 via the electrode pad 736, the connection terminal 724, and the upper pad 722.

The underfill 740 may fill a connection portion between the first chip 710 and the second chip 730, i.e., a connection portion between the connection terminal 724 of the first chip 710 and the electrode pad 736 of the second chip 730. The underfill 740 may include an epoxy resin and include a silica filler and flux. The underfill 740 may include a different material from or the same material as a material included in the encapsulant 750 formed outside the underfill 740. The underfill 740 may be formed to surround the connection portion between the first chip 710 and the second chip 730 and a side surface of the first chip 710 so that the side surface of the first chip 710 may be encapsulated by the underfill 740.

In FIG. 9, the underfill 740 may widen toward a lower portion thereof. However, a shape of the underfill 740 is not limited thereto and may have one of various shapes. For example, the underfill 740 may not surround the side surface of the first chip 710 but be formed only in a space between the first chip 710 and the second chip 730.

The encapsulant 750 may encapsulate the first chip 710 and the second chip 730. The encapsulant 750 may include a polymer. For example, the encapsulant 750 may include an epoxy molding compound (EMC). The encapsulant 750 may encapsulate a side surface of each of the second chip 730 and the underfill 740. In some embodiments, when the underfill 740 is formed only in the space between the first chip 710 and the second chip 730, the encapsulant 750 may encapsulate the side surface of the first chip 710.

A top surface of the second chip 730 may not be encapsulated by the encapsulant 750 but externally exposed.

Figure 10:
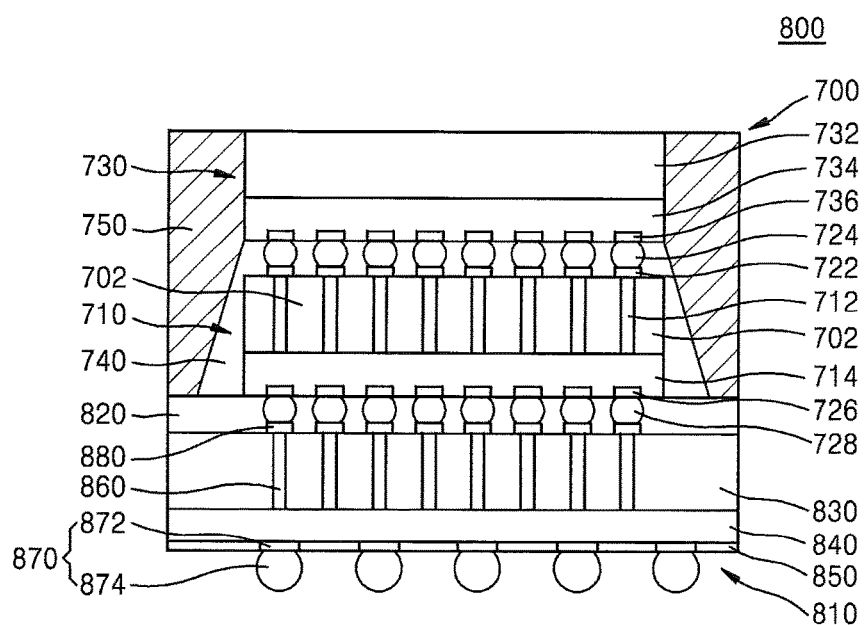
FIG. 10 is a cross-section of a semiconductor package according to some embodiments of the present inventive concept.

Referring now to FIG. 10, a schematic cross-section of a semiconductor package 800 according to some embodiments will be discussed. As illustrated in FIG. 10, the same reference numerals are used to denote the same elements as in FIG. 9 and, therefore, detailed descriptions thereof are omitted in the interest of brevity.

Referring to FIG. 10, the semiconductor package 800 according to the present embodiment may include a main chip 810 and a semiconductor package 700 mounted on the main chip 810. Detailed descriptions of the semiconductor package 700 are similar to those discussed above with respect to FIG. 9.

The main chip 810 may have a horizontal sectional size than each of a first chip 710 and a second chip 730 included in the semiconductor package 700. In some embodiments, the horizontal sectional size of the main chip 810 may be about the same as a horizontal sectional size of the semiconductor package 700 including an encapsulant 750. The semiconductor package 700 may be mounted on the main chip 810 by using an adhesive member 820. Furthermore, a bottom surface of each of the encapsulant 750 and an underfill 740 of the semiconductor package 700 may be adhered to an outer portion of a top surface of the main chip 810 by using the adhesive member 820.

The main chip 810 may include a body layer 830, a lower insulating layer 840, a passivation layer 850, a plurality of TSV units 860 formed through the body layer 830, a plurality of connection terminals 870, and an upper pad 880.

Each of the plurality of TSV units 860 may include a TSV structure 30 and a via insulating layer 40 discussed above with respect to FIGS. 1A to 5. Furthermore, the main chip 810 may include a substrate 12 or 120 and an interlayer insulating layer 14 or 134 having characteristic structures, which are discussed above with respect to FIGS. 1A to 5.

An integrated circuit (IC) layer and a multilayered interconnection pattern may be included in each of the body layer 830 and the lower insulating layer 840. The IC layer and the multilayered interconnection pattern may be formed using a different method than the main chip 810. The main chip 810 may constitute a logic chip, for example, a central processing unit (CPU), a controller, or a customized semiconductor (e.g., an application specific integrated circuit (ASIC).

FIG. 10 illustrates an example in which the semiconductor package 700 is stacked on the main chip 810, but the inventive concept is not limited thereto. For example, the semiconductor package 700 may be mounted directly on a support substrate (e.g., a PCB) or a package substrate.

Each of a plurality of connection terminals 870 formed under the main chip 810 may include a pad 872 and a solder ball 874. The connection terminal 870 formed under the main chip 810 may have a greater size than the connection terminal 728 formed on the semiconductor package 700.

Figure 11:
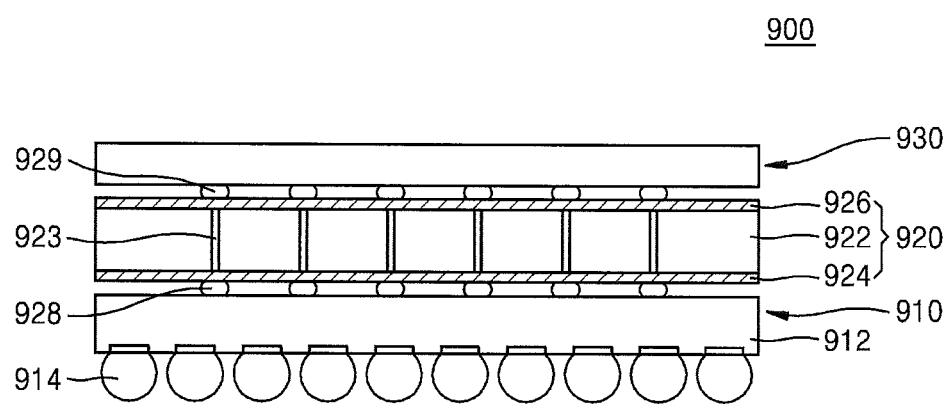
FIG. 11 is a cross-section of a semiconductor package according to some embodiments of the present inventive concept.

Referring now to FIG. 11, a schematic cross-section of a semiconductor package 900 according to some embodiments will be discussed. FIG. 11 illustrates a package-on-package (PoP)-type semiconductor package 900 in which a lower semiconductor package 910 and an upper semiconductor package 930 are bonded to an interposer 920 including a TSV structure by using a flip-chip bonding technique.

As illustrated in FIG. 11, the semiconductor package 900 may include a lower semiconductor package 910, an interposer 920 including a plurality of TSV units 923, and an upper semiconductor package 930.

Each of the plurality of TSV units 923 may include a TSV structure 30 and a via insulating layer 40, which are discussed above with respect to FIGS. 1A to 5.

A plurality of first connection terminals 914 may be adhered to a bottom surface of the substrate 912 of the lower semiconductor package 910. The plurality of first connection terminals 914 may be used to connect the semiconductor package 900 to a main printed circuit board (main PCB) of an electronic device. In some embodiments, the plurality of first connection terminals 914 may include solder balls or solder lands.

The interposer 920 may be used to form a fine-pitch-type vertical connection terminal configured to connect the lower semiconductor package 910 with the upper semiconductor package 930. A planar size of a PoP-type IC device may be reduced by adopting the interposer 920. The interposer 920 may include a silicon layer 922 penetrated by the plurality of TSV units 923 and redistribution layers 924 and 926 formed on a bottom surface and a top surface of the silicon layer 922, respectively, and configured to redistribute the plurality of TSV units 923. In some embodiments, at least one of the redistribution layers 924 and 926 may be omitted.

A plurality of second connection terminals 928 configured to connect the plurality of TSV units 923 with the substrate 912 of the lower semiconductor package 910 may be formed on a bottom surface of the interposer 920. A plurality of third connection terminal 929 configured to connect the plurality of TSV units 923 and the upper semiconductor package 930 may be formed on a top surface of the interposer 920. In some embodiments, each of the second connection terminal 928 and the third connection terminal 929 may include a solder bump or a solder land.

When the semiconductor package 900 is a semiconductor device used for a mobile phone, the lower semiconductor package 910 may be a logic device, such as a processor, and the upper semiconductor package 930 may be a memory device.

In some embodiments, the upper semiconductor package 930 may be a multi-chip package including a plurality of stacked semiconductor chips (not shown). An upper portion of the upper semiconductor package 930 may be encapsulated with an encapsulant (not shown) to protect semiconductor chips.

Figure 12:
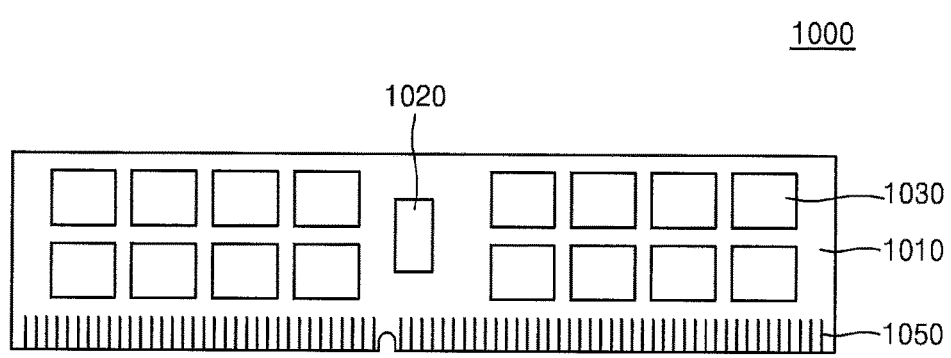
FIG. 12 is a plan view of main elements of an IC device according to some embodiments of the present inventive concept.

Referring now to FIG. 12, a plan view of main elements of an IC device 1000 according to some embodiments will be discussed. The IC device 1000 may include a module substrate 1010 and a control chip 1020 and a plurality of semiconductor packages 1030 mounted on the module substrate 1010. A plurality of input/output (I/O) terminals 1150 may be formed on the module substrate 1010.

Each of the plurality of semiconductor packages 1030 may include at least one of the IC devices 10A, 10B, 10C, 10D, 10E, 100, and 200 discussed above with respect to FIGS. 1A to 5.

Figure 13:
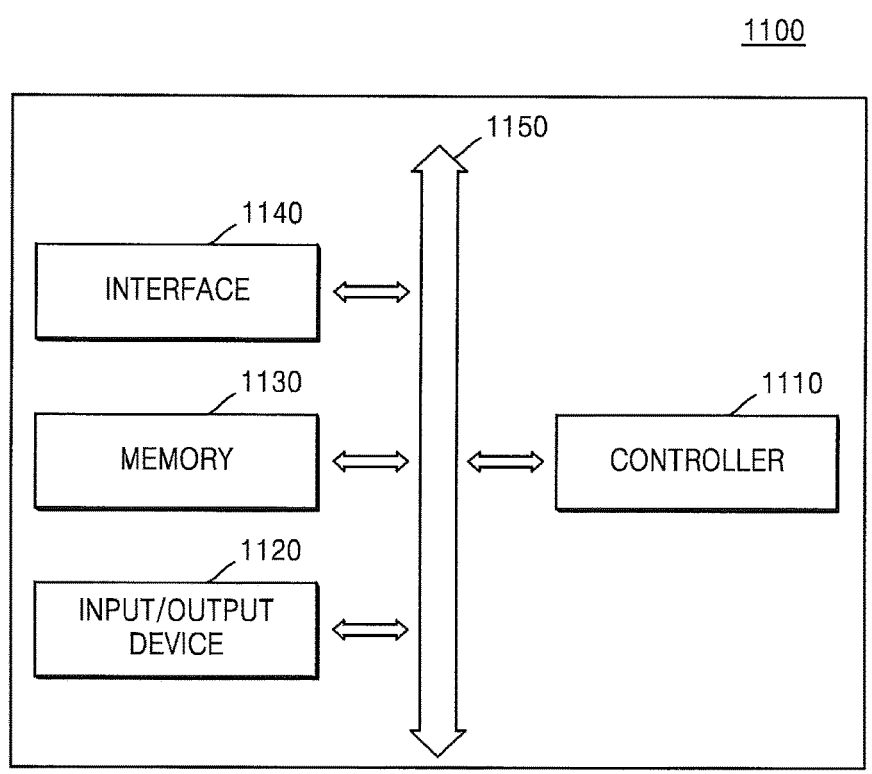
FIG. 13 is a diagram of main elements of an IC device according to some embodiments of the present inventive concept.

Referring now to FIG. 13, a diagram of main elements of an IC device 1100 according some embodiments will be discussed. The IC device 1100 may include a controller 1110, an I/O device 1120, a memory 1130, and an interface 1140. The IC device 1100 may be a mobile system or a system configured to receive or transmit information. In some embodiments, the mobile system may be at least one of a personal digital assistant (PDA), a portable computer, a web tablet, a wireless phone, a mobile phone, a digital music player, or a memory card.

In some embodiments, the controller 1110 may be a microprocessor (MP), a digital signal processor (DSP), or a microcontroller (MC).

The I/O device 1120 may be used to input and output data to or from the IC device 1100. The IC device 1100 may be connected to an external apparatus (e.g., a personal computer (PC) or a network) by using the I/O device 1120 or exchange data with the external apparatus. In some embodiments, the I/O device 1120 may be a keypad, a keyboard, or a display device.

In some embodiments, the memory 1130 may store codes and/or data for operations of the controller 1110. In other embodiments, the memory 1130 may store data processed by the controller 1110. At least one of the controller 1110 and the memory 1130 may include at least one of the IC devices 10A, 10B, 10C, 10D, 10E, 100, and 200 discussed above with respect to FIGS. 1A to 5.

The interface 1140 may function as a data transmission path between the IC device 1100 and another external apparatus. The controller 1110, the I/O device 1120, the memory 1130, and the interface 1140 may communicate with one another via a bus 1150.

The IC device 1100 may be included in a mobile phone, a MP3 player, a navigation system, a portable multimedia player (PMP), a solid-state disk (SSD), or a household appliance.

While the inventive concept has been particularly shown and described with reference to some embodiments thereof, it will be understood that various changes in form and details may be made therein without departing from the spirit and scope of the following claims.

What is claimed is:

1. An integrated circuit (IC) device comprising:
    a substrate having a first sidewall defining a first through hole that is a portion of a through-silicon via (TSV) space;
    an interlayer insulating layer having a second sidewall and a protrusion,
        wherein the second sidewall defines a second through hole providing another portion of the TSV space and communicating with the first through hole; and
        wherein the protrusion protrudes toward an inside of the TSV space and defines an undercut region in the first through hole;
    a TSV structure extending into the substrate and the interlayer insulating layer and through the first through hole and the second through hole; and
    a via insulating layer surrounding the TSV structure in the first through hole and the second through hole.

2. The IC device of claim 1, wherein the second sidewall has an inclined sidewall portion.

3. The IC device of claim 1, wherein a width of at least a portion of the second through hole gradually increases away from the substrate.

4. The IC device of claim 1:
    wherein the second sidewall has an inclined sidewall portion; and
    wherein in the protrusion, an angle formed between a bottom surface of the interlayer insulating layer and the inclined sidewall portion of the second sidewall ranges from about 75° to about 85°.

5. The IC device of claim 1, wherein a horizontal distance from a central portion of the TSV space to the protrusion is less than a horizontal distance from the central portion of the TSV space to the first sidewall.

6. The IC device of claim 1, wherein a width of an end portion of the second through hole nearer to the substrate than to the interlayer insulating layer is less than a width of an end portion of the first through hole nearer to the interlayer insulating layer than to the substrate.

7. The IC device of claim 1, wherein the via insulating layer comprises a protrusion region located in the undercut region.

8. The IC device of claim 7, wherein the protrusion region of the via insulating layer is in contact with a bottom surface of the interlayer insulating layer.

9. The IC device of claim 1:
wherein the substrate comprises a protrusion having an inclined sidewall; and
wherein the inclined sidewall is a portion of the first sidewall adjacent to the interlayer insulating layer.

10. The IC device of claim 1:
wherein a first portion of the via insulating layer covers the first sidewall in the undercut region and a second portion of the via insulating layer covers the protrusion in the second through hole; and
wherein a width of the first portion in a horizontal direction is greater than a width of the second portion in the horizontal direction.

11. The IC device of claim 1:
wherein the interlayer insulating layer comprises a multilayered structure including a plurality of stacked insulating layers; and
wherein the second sidewall comprises a first surface portion having a corrugated shape.

12. The IC device of claim 11, wherein the via insulating layer comprises a second surface portion that contacts the first surface portion and has a corrugated shape corresponding to the corrugated shape of the first surface portion.

13. The IC device of claim 1:
wherein the interlayer insulating layer comprises a first insulating layer and a second insulating layer, the first insulating layer comprising a material different from a material included in the second insulating layer; and
wherein a first width of a portion of the second through hole, which is defined by the first insulating layer, in a horizontal direction, is different from a second width of a portion of the second through hole, which is defined by the second insulating layer, in the horizontal direction.

14. The IC device of claim 13:
wherein the via insulating layer comprises a first outer wall portion contacting the first insulating layer and a second outer wall portion contacting the second insulating layer; and
wherein a horizontal distance between the TSV structure and the first outer wall portion is different from a horizontal distance between the TSV structure and the second outer wall portion.

15. The IC device of claim 1, wherein the TSV structure comprises:
a conductive plug extending into the substrate and the interlayer insulating layer; and
a conductive barrier layer surrounding the conductive plug, in the first through hole and the second through hole,
wherein each of the conductive plug and the conductive barrier layer comprises a concave portion facing the protrusion and recessed toward a central portion of the TSV space.

16. The IC device of claim 1, further comprising:
a front-end-of-line (FEOL) structure on the substrate; and
a back-end-of-line (BEOL) structure on the FEOL structure,
wherein the FEOL structure comprises the interlayer insulating layer, and the BEOL structure covers the TSV structure and the interlayer insulating layer.

17. The IC device of claim 1, further comprising:
an FEOL structure formed on the substrate; and
a BEOL structure formed on the FEOL structure,
wherein the TSV structure penetrates the FEOL structure and the BEOL structure.

18. An integrated circuit (IC) device comprising:
semiconductor structures comprising a substrate and an interlayer insulating layer, wherein the interlayer insulating layer is formed on the substrate and has a sidewall having an inclined sidewall portion;
a TSV structure extending into the substrate and the interlayer insulating layer; and
a via insulating layer extending into the substrate and the interlayer insulating layer and surrounding the TSV structure, the via insulating layer comprising a protrusion region facing an interface portion between the substrate and the interlayer insulating layer and an inclined surface contacting the inclined sidewall portion.

19. The IC device of claim 18, wherein an angle formed between a bottom surface of the interlayer insulating layer and the inclined sidewall portion ranges from about 75° to about 85°.

20. The IC device of claim 18:
wherein the interlayer insulating layer comprises a protrusion, which protrudes toward the inside of the TSV structure; and
wherein the protrusion region of the via insulating layer is in contact with the protrusion.

21. An integrated circuit (IC) device comprising:
a substrate having a first sidewall defining a first through hole that is a portion of a through-silicon via (TSV) space;
an interlayer insulating layer having a second sidewall and a protrusion,
wherein the second sidewall defines a second through hole providing another portion of the TSV space and coupled to the first through hole;
wherein the protrusion protrudes toward an inside of the TSV space and defines an undercut region in the first through hole;
wherein the second sidewall has an inclined sidewall portion; and
wherein in the protrusion, an angle formed between a bottom surface of the interlayer insulating layer and the inclined sidewall portion of the second sidewall ranges from about 75° to about 85°.

22. The IC device of claim 21, further comprising:
a TSV structure extending into the substrate and the interlayer insulating' layer and through the first through hole and the second through hole; and
a via insulating layer surrounding the TSV structure in the first through hole and the second through hole.

23. The IC device of claim 22, wherein the via insulating layer comprises a protrusion region located in the undercut region.

24. The IC device of claim 21, wherein a horizontal distance from a central portion of the TSV space to the protrusion is less than a horizontal distance from the central portion of the TSV space to the first sidewall.

25. The IC device of claim 21, wherein a width of an end portion of the second through hole nearer to the substrate than to the interlayer insulating layer is less than a width of an end portion of the first through hole nearer to the interlayer insulating layer than to the substrate.

\* \* \* \* \*